US012805138B2

(12) United States Patent
Yu et al.

(10) Patent No.: US 12,805,138 B2
(45) Date of Patent: Nov. 17, 2026

(54) ARRAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Ziyang Yu, Beijing (CN); Mengqi Wang, Beijing (CN); Wenbo Chen, Beijing (CN); Zhiliang Jiang, Beijing (CN)

(73) Assignees: Chengdu BOE Optoelectronics Technolgies Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 19/218,540

(22) Filed: May 26, 2025

(65) Prior Publication Data

US 2025/0287801 A1 Sep. 11, 2025

Related U.S. Application Data

(63) Continuation of application No. 19/028,513, filed on Jan. 17, 2025, which is a continuation of application No. 18/041,074, filed as application No. PCT/CN2022/090337 on Apr. 29, 2022, now Pat. No. 12,238,993.

(51) Int. Cl.
*H10K 59/131* (2023.01)
*G09G 3/3233* (2016.01)

(52) U.S. Cl.
CPC ......... *H10K 59/131* (2023.02); *G09G 3/3233* (2013.01); *G09G 2300/0426* (2013.01); *G09G 2300/0819* (2013.01); *G09G 2300/0842* (2013.01)

(58) Field of Classification Search
CPC .. H10K 59/131; H10K 59/123; H10K 59/121; H10K 59/122; G09G 3/3233; G09G 2300/0426; G09G 2300/0819; G09G 2300/0842; G09G 2300/0861; G09G 2310/0251; G09G 3/3225; G09G 2300/0439; G09G 3/3607; H10D 86/40; H10D 86/441; H10D 86/60
See application file for complete search history.

(56) References Cited

U.S. PATENT DOCUMENTS 10,852,607 B2 * 12/2020 Yeh .................... H10K 59/122
11,521,545 B2 * 12/2022 Cho .................... G09G 3/3225
(Continued)

*Primary Examiner* — Ibrahim A Khan
(74) *Attorney, Agent, or Firm* — Intellectual Valley Law, P.C.

(57) ABSTRACT

An array substrate is provided. The array substrate includes a plurality of light emitting elements, a plurality of pixel driving circuits configured to drive light emission in the plurality of light emitting elements, a plurality of data lines at least partially, and a plurality of data lead lines in a second region, the plurality of data lead lines electrically connecting the plurality of data lines to an integrated circuit. An orthographic projection of at least one light emitting element of the plurality of light emitting elements on a base substrate at least partially overlaps with an orthographic projection of the plurality of data lead lines on the base substrate.

19 Claims, 28 Drawing Sheets

(56) References Cited

U.S. PATENT DOCUMENTS

| | | | | |
|---|---|---|---|---|
| 11,793,032 | B2 * | 10/2023 | Jeong | H10D 86/481 257/91 |
| 12,004,409 | B2 * | 6/2024 | Tian | G02F 1/13312 |
| 2016/0190166 | A1 * | 6/2016 | Kim | G09G 3/3233 257/71 |
| 2017/0288002 | A1 * | 10/2017 | Kim | H10K 59/121 |
| 2018/0040680 | A1 * | 2/2018 | Cai | H10K 77/111 |
| 2020/0064702 | A1 * | 2/2020 | Yeh | G02F 1/136286 |
| 2020/0098843 | A1 * | 3/2020 | Jeon | H10K 59/1216 |
| 2020/0381505 | A1 * | 12/2020 | Cho | G02F 1/1345 |
| 2021/0066433 | A1 * | 3/2021 | Cha | H10K 59/131 |
| 2021/0233474 | A1 * | 7/2021 | Lee | G09G 3/3266 |
| 2021/0313539 | A1 * | 10/2021 | Jeon | H10K 50/822 |
| 2021/0351259 | A1 * | 11/2021 | Lee | H10K 59/131 |
| 2021/0376036 | A1 * | 12/2021 | Park | H10K 59/131 |
| 2021/0376038 | A1 * | 12/2021 | Won | G09G 3/3266 |
| 2022/0028949 | A1 * | 1/2022 | Ko | H10K 59/121 |
| 2022/0045151 | A1 * | 2/2022 | Jeong | H10D 86/481 |
| 2022/0068211 | A1 * | 3/2022 | Jeong | G09G 3/3233 |
| 2022/0102470 | A1 * | 3/2022 | Seo | H10K 59/123 |
| 2022/0115462 | A1 * | 4/2022 | Jung | H10K 59/121 |
| 2022/0149144 | A1 * | 5/2022 | Lee | H10K 59/121 |
| 2022/0208866 | A1 * | 6/2022 | Park | H10K 59/65 |
| 2022/0208870 | A1 * | 6/2022 | Choi | H10K 59/121 |
| 2022/0208912 | A1 * | 6/2022 | Jeon | H10K 59/123 |
| 2022/0285452 | A1 * | 9/2022 | Kang | G09G 3/3233 |
| 2022/0285456 | A1 * | 9/2022 | Hong | H10K 59/121 |
| 2022/0392983 | A1 * | 12/2022 | Choi | H10K 59/131 |
| 2022/0415996 | A1 * | 12/2022 | Jeong | H10K 59/131 |
| 2023/0079023 | A1 * | 3/2023 | Lee | H10K 59/131 257/40 |
| 2023/0108100 | A1 * | 4/2023 | Park | H10D 86/411 257/40 |

* cited by examiner

ARRAY SUBSTRATE AND DISPLAY APPARATUS

CROSS-REFERENCE TO RELATED APPLICATION

This application is a continuation of U.S. application Ser. No. 19/028,513, filed Jan. 17, 2025, which is a continuation of U.S. application Ser. No. 18/041,074, filed Apr. 29, 2022, which is a national stage application under 35 U.S.C. § 371 of International Application No. PCT/CN2022/090337, filed Apr. 29, 2022. Each of the forgoing applications is herein incorporated by reference in its entirety for all purposes.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides an array substrate, comprising a plurality of light emitting elements, a plurality of pixel driving circuits configured to drive light emission in the plurality of light emitting elements, a plurality of data lines at least partially, and a plurality of data lead lines, the plurality of data lead lines electrically connecting the plurality of data lines to an integrated circuit; wherein an orthographic projection of at least one light emitting element of the plurality of light emitting elements on a base substrate at least partially overlaps with an orthographic projection of the plurality of data lead lines on the base substrate.

Optionally, an orthographic projection of at least one data lead line of the plurality of data lead lines on the base substrate partially overlaps with an orthographic projection of the plurality of light emitting elements on the base substrate; and an extension direction of at least a portion of the at least one data lead line is different from an extension direction of a data line connected to the at least one data lead line.

Optionally, a data lead line of the plurality of data lead lines comprises a first part and a second part; an extension direction of the first part is the same as an extension direction of a data line connected to the data lead line; and an extension direction of the second part is different from the extension direction of the data line connected to the data lead line.

Optionally, a data lead line of the plurality of data lead lines connects to a data line of the plurality of data lines at a connection point; and an extension direction of the data line changes to an extension direction of the data lead line at the connection point.

Optionally, at least a portion of a data lead line of the plurality of data lead lines is in a layer different from a data line of the plurality of data lines; and the at least the portion of the data lead line connects to the data line through a via extending through at least one insulating layer.

Optionally, the via is at least partially in a light emitting area having one or more light emitting elements.

Optionally, the array substrate further comprises an anode connecting line; a planarization layer on the anode connecting line; and an anode layer on a side of the planarization layer away from the anode connecting line; wherein an anode in the anode layer connects to the anode connecting line through a via extending through the planarization layer.

Optionally, at least a portion of at least one data lead line of the plurality of data lead lines are in a same layer as a data line connected to the at least one data lead line.

Optionally, at least a portion of at least one data lead line of the plurality of data lead lines are in a layer different from a data line connected to the at least one data lead line.

Optionally, at least two data lead lines of the plurality of data lead lines have different lengths.

Optionally, the array substrate further comprises a peripheral region; wherein the peripheral region comprises a first peripheral sub-region on a first side, a second peripheral sub-region on a second side, a third peripheral sub-region on a third side, and a fourth peripheral sub-region on a fourth side; and the array substrate further comprises a gate-on-array circuit on at least one of the third peripheral sub-region or the fourth peripheral sub-region.

Optionally, the array substrate further comprises a plurality of connecting lines connecting the plurality of pixel driving circuits with the plurality of light emitting elements, respectively; wherein two terminals of a respective connecting line of the plurality of connecting lines intersects with a column direction.

Optionally, an extension direction of at least a portion of at least one connecting line of the plurality of connecting lines is parallel to the column direction.

Optionally, the array substrate further comprises a plurality of connecting lines connecting the plurality of pixel driving circuits with the plurality of light emitting elements, respectively; wherein an orthographic projection of at least one connecting line of the plurality of connecting lines on the base substrate at least partially overlaps with an orthographic projection of the plurality of data lead lines on the base substrate.

Optionally, the plurality of connecting lines extend on the array substrate without intersecting each other.

Optionally, the plurality of data lead lines are in a region absent of transistors and capacitors of the plurality of pixel driving circuits; and multiple light emitting elements of the plurality of light emitting elements are present in the region having the plurality of data lead lines.

Optionally, extension directions of at least portions of the plurality of data lead lines are different from an extension direction of the plurality of data lines.

Optionally, a respective data lead line of the plurality of data lead lines extends from a connection point with a respective data line of the plurality of data lines to the integrated circuit.

Optionally, a shortest distance between the light emitting area and an integrated circuit is in a range of 1000 μm to 10000 μm.

In another aspect, the present disclosure provides an array substrate, comprising a plurality of light emitting elements and a plurality of pixel driving circuits configured to drive light emission in the plurality of light emitting elements; wherein, in a first region, transistors of multiple pixel driving circuits of the plurality of pixel driving circuits are present, and the plurality of light emitting elements are absent; and in a second region, multiple light emitting elements of the plurality of light emitting elements are present, and transistors of the plurality of pixel driving circuits are absent.

Optionally, in the first region, transistors of at least one row of pixel driving circuits are present, and the plurality of light emitting elements are absent; and in the second region, at least one row of light emitting elements are present, and transistors of the plurality of pixel driving circuits are absent.

Optionally, in a third region, multiple rows of light emitting elements and transistors of multiple rows of pixel driving circuits are present; and the first region and the second region are on two sides of the third region.

Optionally, the array substrate further comprises a plurality of connecting lines connecting the plurality of pixel driving circuits with the plurality of light emitting elements, respectively; wherein an orthographic projection of a respective connecting line of the plurality of connecting lines on a base substrate intersects with an orthographic projection of at least one row of pixel driving circuits other than the respective pixel driving circuit on the base substrate.

Optionally, included angles between extension directions of the plurality of connecting lines are between 0 degree to 30 degrees.

Optionally, the plurality of connecting lines are arranged in an array comprising rows and columns, the array being at least partially present in the first region and at least partially present in the second region.

Optionally, a ratio of a total number of rows of connecting lines to a total number of rows of subpixels configured to emit light is in a range of 0.9 to 1.1, and a ratio of a total number of columns of connecting lines to a total number of columns of subpixels configured to emit light is in a range of 0.9 to 1.1.

Optionally, the plurality of connecting lines extend along a direction from the first region to the second region.

Optionally, multiple first connecting lines of the plurality of connecting lines connect the multiple pixel driving circuits in the first region with multiple corresponding light emitting elements in a third region between the first region and the second region; and multiple second connecting lines of the plurality of connecting lines connect the multiple light emitting elements in the second region with multiple corresponding pixel driving circuits in the third region.

Optionally, the plurality of connecting lines are in a third signal line layer; wherein the array substrate further comprises a second planarization layer on a side of the third signal line layer closer to a base substrate; a third planarization layer on a side of the third signal line layer away from the base substrate; and an anode layer on a side of the third planarization layer away from the third signal line layer; wherein the plurality of pixel driving circuits are on a side of the second planarization layer away from the third signal line layer.

Optionally, the third region spaces apart the first region and the second region, multiple rows of light emitting elements and transistors of multiple rows of pixel driving circuit are present in the third region.

Optionally, in the third region, an orthographic projection of an individual light emitting layer of an individual light emitting element of the plurality of light emitting elements on a base substrate at least partially overlaps with an orthographic projection of an individual pixel driving circuit of the plurality of pixel driving circuits on the base substrate, the individual pixel driving circuit being configured to drive light emission in a light emitting element different from the individual light emitting element.

Optionally, in the third region, an orthographic projection of an individual anode of an individual light emitting element of the plurality of light emitting elements on a base substrate at least partially overlaps with an orthographic projection of an individual pixel driving circuit of the plurality of pixel driving circuits on the base substrate, the individual pixel driving circuit being configured to drive light emission in a light emitting element different from the individual light emitting element.

Optionally, the array substrate further comprises a plurality of data lines at least partially in the third region and a plurality of data lead lines in the second region, the plurality of data lead lines electrically connecting the plurality of data lines to an integrated circuit; wherein an orthographic projection of the multiple light emitting elements in the second region on a base substrate at least partially overlaps with an orthographic projection of the plurality of data lead lines on the base substrate.

Optionally, the array substrate further comprises a peripheral region surrounding a combination of the first region, the second region, and the third region; wherein the peripheral region comprises a first peripheral sub-region on a first side, a second peripheral sub-region on a second side, a third peripheral sub-region on a third side, and a fourth peripheral sub-region on a fourth side; and the array substrate further comprises a gate-on-array circuit on at least one of the third peripheral sub-region or the fourth peripheral sub-region.

Optionally, an orthographic projection of a respective light emitting layer of a respective light emitting element of the plurality of light emitting elements on a base substrate is non-overlapping with an orthographic projection of a corresponding pixel driving circuit of the plurality of pixel driving circuits on the base substrate, the corresponding pixel driving circuit configured to drive light emission in the respective light emitting element.

Optionally, orthographic projections of any electrically connected pair of pixel driving circuit and light emitting layer on a base substrate are non-overlapping; and any pair of pixel driving circuit and light emitting layer having overlapping orthographic projections on the base substrate are electrically separated.

Optionally, an orthographic projection of a respective anode of a respective light emitting element of the plurality of light emitting elements on a base substrate is non-overlapping with an orthographic projection of a corresponding pixel driving circuit of the plurality of pixel driving circuits on the base substrate, the corresponding pixel driving circuit configured to drive light emission in the respective light emitting element.

Optionally, orthographic projections of any electrically connected pair of pixel driving circuit and anode on a base substrate are non-overlapping; and any pair of pixel driving circuit and anode having overlapping orthographic projections on the base substrate are electrically separated.

In another aspect, the present disclosure provides a display apparatus, comprising the array substrate described herein or fabricated by a method described herein, and one or more integrated circuit connected to the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a plurality of light emitting elements and a plurality of pixel driving circuits configured to drive light emission in the plurality of light emitting elements. Optionally, in a first region, transistors of multiple pixel driving circuits of the plurality of pixel driving circuits are present, and the plurality of light emitting elements are absent. Optionally, in a second region, multiple light emitting elements of the plurality of light emitting elements are present, and transistors of the plurality of pixel driving circuits are absent.

Figure 1:
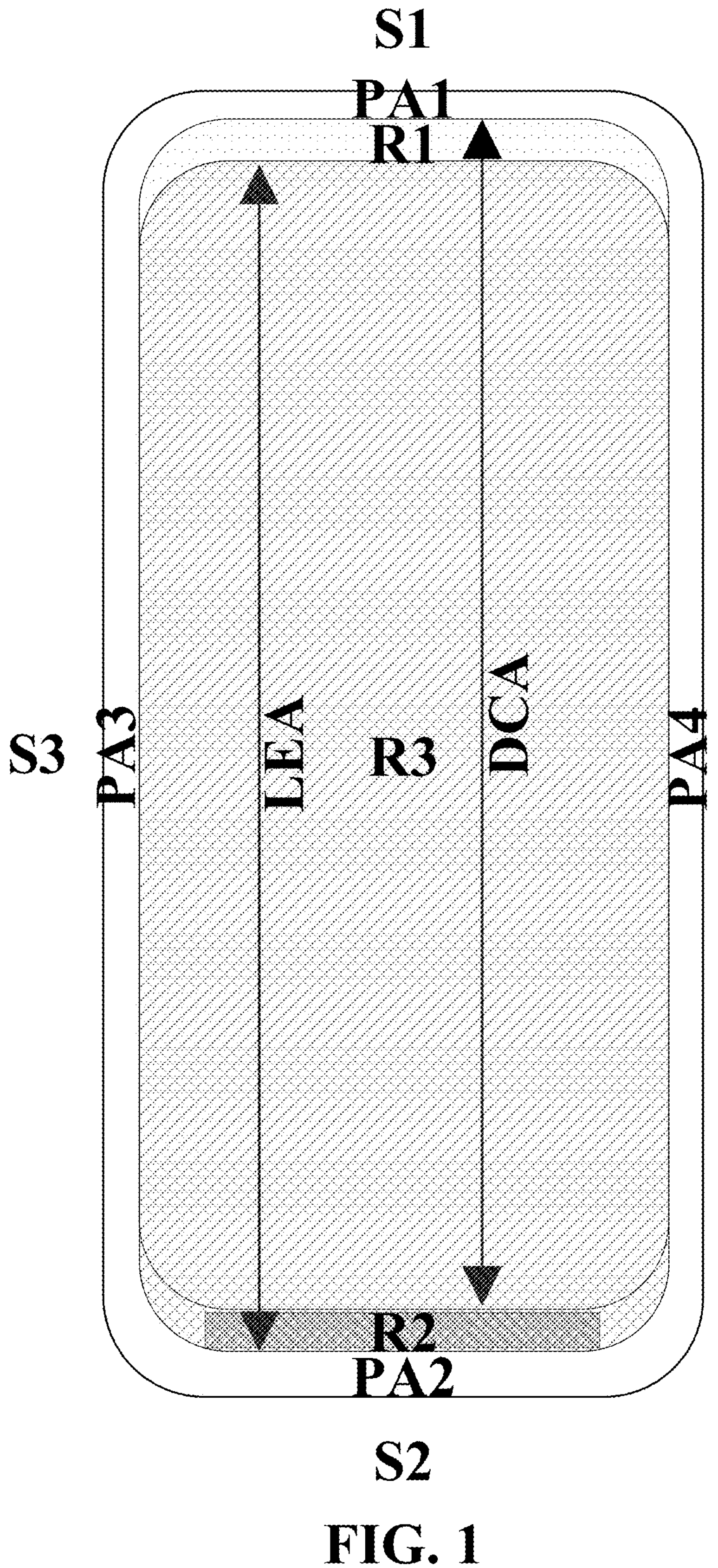
FIG. 1 is a schematic diagram illustrating the structure of an array substrate in some embodiments according to the present disclosure.

FIG. 1 is a schematic diagram illustrating the structure of an array substrate in some embodiments according to the present disclosure. Referring to FIG. 1, the array substrate in some embodiments includes a first region R1 and a second region R2. In the first region R1, transistors and capacitors of multiple pixel driving circuits of the plurality of pixel driving circuits are present. The plurality of light emitting elements are absent in the first region R1. In the second region R2, multiple light emitting elements of the plurality of light emitting elements are present. Transistors and capacitors of the plurality of pixel driving circuits are absent in the second region R2.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is an 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 2:
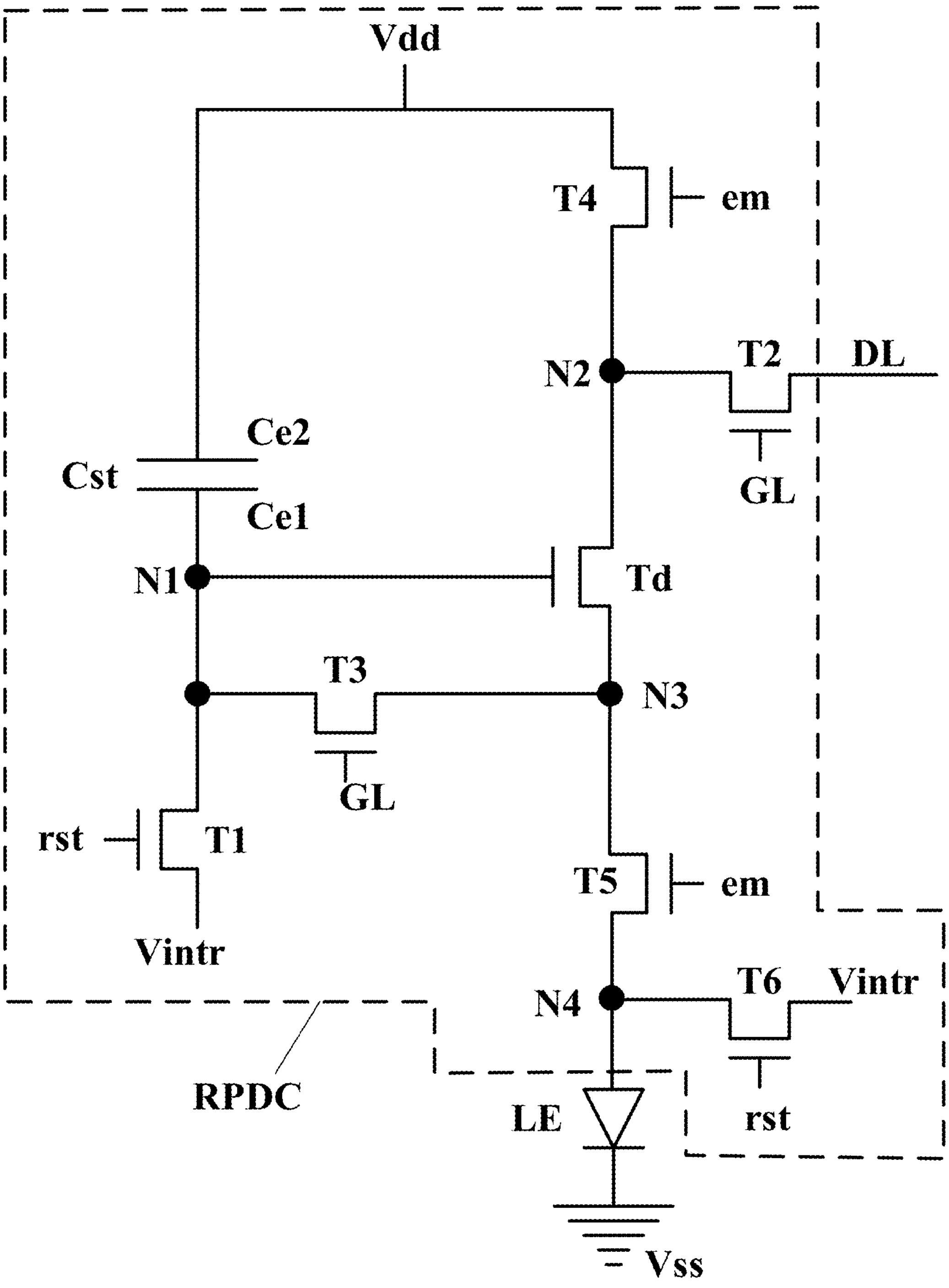
FIG. 2 is a circuit diagram illustrating the structure of a respective pixel driving circuit and a respective light emitting element in some embodiments according to the present disclosure.

FIG. 2 is a circuit diagram illustrating the structure of a respective pixel driving circuit and a respective light emitting element in some embodiments according to the present disclosure. Referring to FIG. 2, in some embodiments, the respective pixel driving circuit RPDC includes a driving transistor Td; a storage capacitor Cst having a first capacitor electrode Ce1 and a second capacitor electrode Ce2; a first transistor T1 having a gate electrode connected to a respective reset control signal line of a plurality of reset control signal lines rst, a source electrode connected to a respective first reset signal line of a plurality of first reset signal lines Vintr, and a drain electrode connected to a first capacitor electrode Ce1 of the storage capacitor Cst and a gate electrode of the driving transistor Td; a second transistor T2 having a gate electrode connected to a respective gate line of a plurality of gate lines GL, a source electrode connected to a respective data line of a plurality of data lines DL, and a drain electrode connected to a source electrode of the driving transistor Td; a third transistor T3 having a gate electrode connected to the respective gate line, a drain electrode connected to the first capacitor electrode Ce1 of the storage capacitor Cst and the gate electrode of the driving transistor Td, and a source electrode connected to a drain electrode of the driving transistor Td; a fourth transistor T4 having a gate electrode connected to a respective light emitting control signal line of a plurality of light emitting control signal lines em, a source electrode connected to a respective voltage supply line of a plurality of voltage supply lines Vdd, and a drain electrode connected to the source electrode of the driving transistor Td and the drain electrode of the second transistor T2; a fifth transistor T5 having a gate electrode connected to the respective light emitting control signal line, a source electrode connected to the drain electrodes of the driving transistor Td and the source electrode of the third transistor T3, and a drain electrode connected to an anode of a light emitting element LE; and a sixth transistor T6 having a gate electrode connected to the respective reset control signal line of the plurality of reset control signal lines rst, a source electrode connected to the respective first reset signal line of the plurality of first reset signal lines Vintr, and a drain electrode connected to the drain electrode of the fifth transistor and the anode of the light emitting element LE. The second capacitor electrode Ce2 is connected to the respective voltage supply line and the source electrode of the fourth transistor T4.

Figure 3:
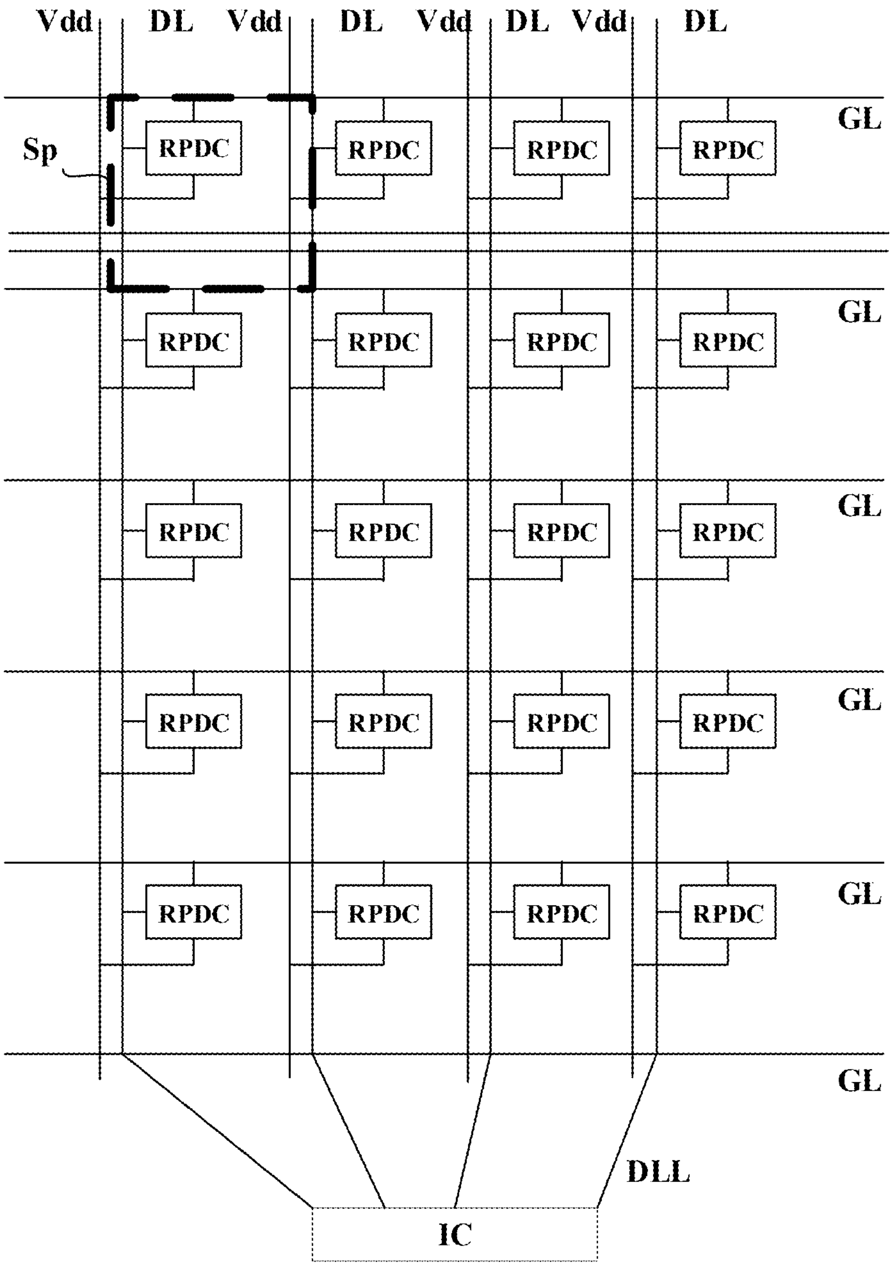
FIG. 3 is a plan view of an array substrate in some embodiments according to the present disclosure.

FIG. 3 is a plan view of an array substrate in some embodiments according to the present disclosure. Referring to FIG. 3, the array substrate includes an array of subpixels Sp. Each subpixel includes an electronic component, e.g., a light emitting element. In one example, the light emitting element is driven by a respective pixel driving circuit RPDC. The array substrate includes a plurality of gate lines GL, a plurality of data lines DL, and a plurality of high voltage signal lines Vdd. Light emission in a respective subpixel is driven by a respective pixel driving circuit RPDC. In one example, a high voltage signal is input, through a respective one of the plurality of high voltage signal lines Vdd, to the respective pixel driving circuit RPDC connected to an anode of the light emitting element; a low voltage signal is input to a cathode of the light emitting element. A voltage difference between the high voltage signal (e.g., the VDD signal) and the low voltage signal (e.g., the VSS signal) is a driving voltage $\Delta V$ that drives light emission in the light emitting element.

The array substrate in some embodiments includes a plurality of subpixels. In some embodiments, the plurality of subpixels includes a respective first subpixel, a respective second subpixel, a respective third subpixel, and a respective fourth subpixel. Optionally, a respective pixel of the array substrate includes the respective first subpixel, the respective second subpixel, the respective third subpixel, and the respective fourth subpixel. The plurality of subpixels in the array substrate are arranged in an array. In one example, the array of the plurality of subpixels includes a S1-S2-S3-S4 format repeating array, in which S1 stands for the respective first subpixel, S2 stands for the respective second subpixel, S3 stands for the respective third subpixel, and S4 stands for the respective fourth subpixel. In another example, the S1-S2-S3-S4 format is a C1-C2-C3-C4 format, in which C1 stands for the respective first subpixel of a first color, C2 stands for the respective second subpixel of a second color, C3 stands for the respective third subpixel of a third color, and C4 stands for the respective fourth subpixel of a fourth color. In another example, the S1-S2-S3-S4 format is a C1-C2-C3-C2' format, in which C1 stands for the respective first subpixel of a first color, C2 stands for the respective second subpixel of a second color, C3 stands for the respective third subpixel of a third color, and C2' stands for the respective fourth subpixel of the second color. In another example, the C1-C2-C3-C2' format is a R-G-B-G format, in which the respective first subpixel is a red subpixel, the respective second subpixel is a green subpixel, the respective third subpixel is a blue subpixel, and the respective fourth subpixel is a green subpixel.

In some embodiments, a minimum repeating unit of the plurality of subpixels of the array substrate includes the respective first subpixel, the respective second subpixel, the respective third subpixel, and the respective fourth subpixel. Optionally, each of the respective first subpixel, the respective second subpixel, the respective third subpixel, and the respective fourth subpixel, includes the first transistor T1, the second transistor T2, the third transistor T3, the fourth transistor T4, the fifth transistor T5, the sixth transistor T6, and the driving transistor Td.

Figure 4A:
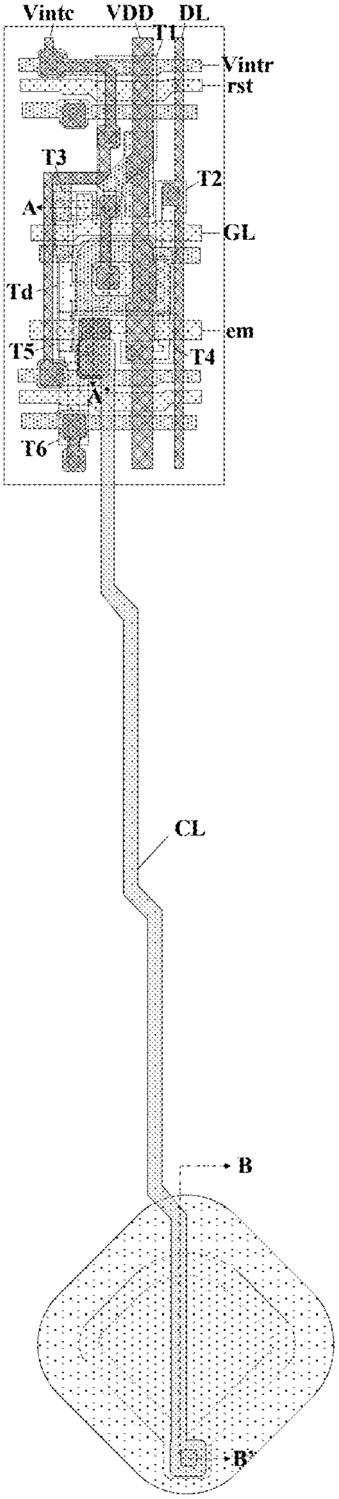
FIG. 4A illustrates the structure of a respective pixel driving circuit and a respective light emitting element in some embodiments according to the present disclosure.
Figure 4B:
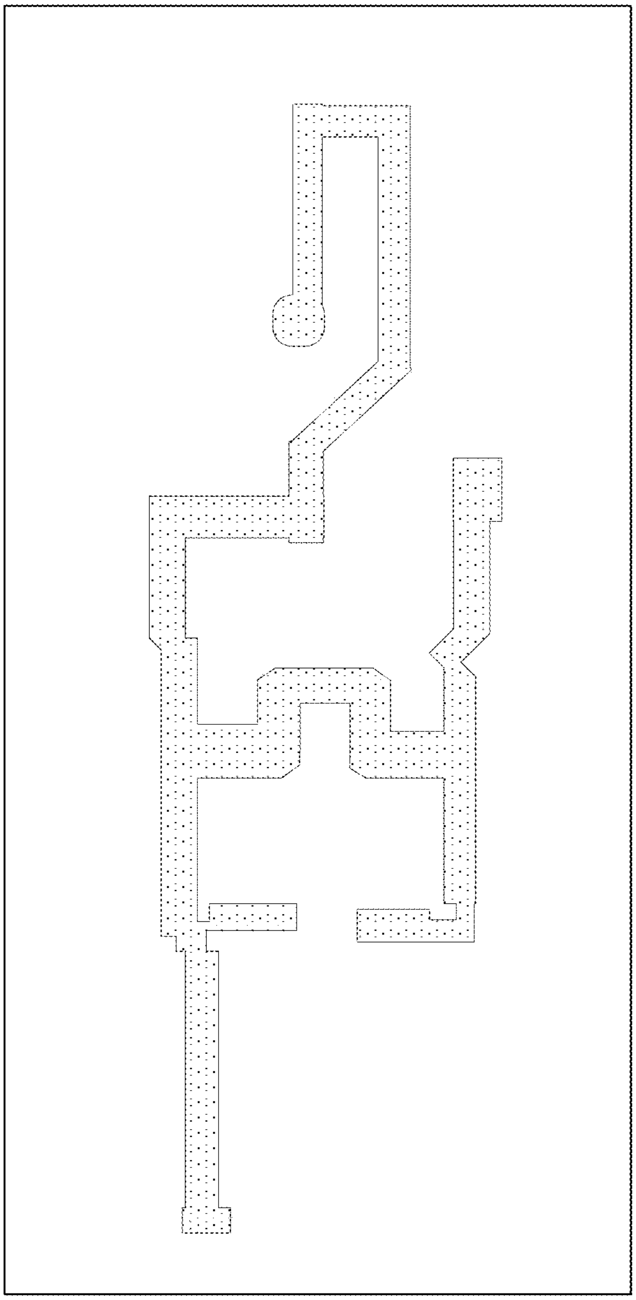
FIG. 4B illustrates the structure of a semiconductor material layer in an array substrate depicted in FIG. 4A.
Figure 4C:
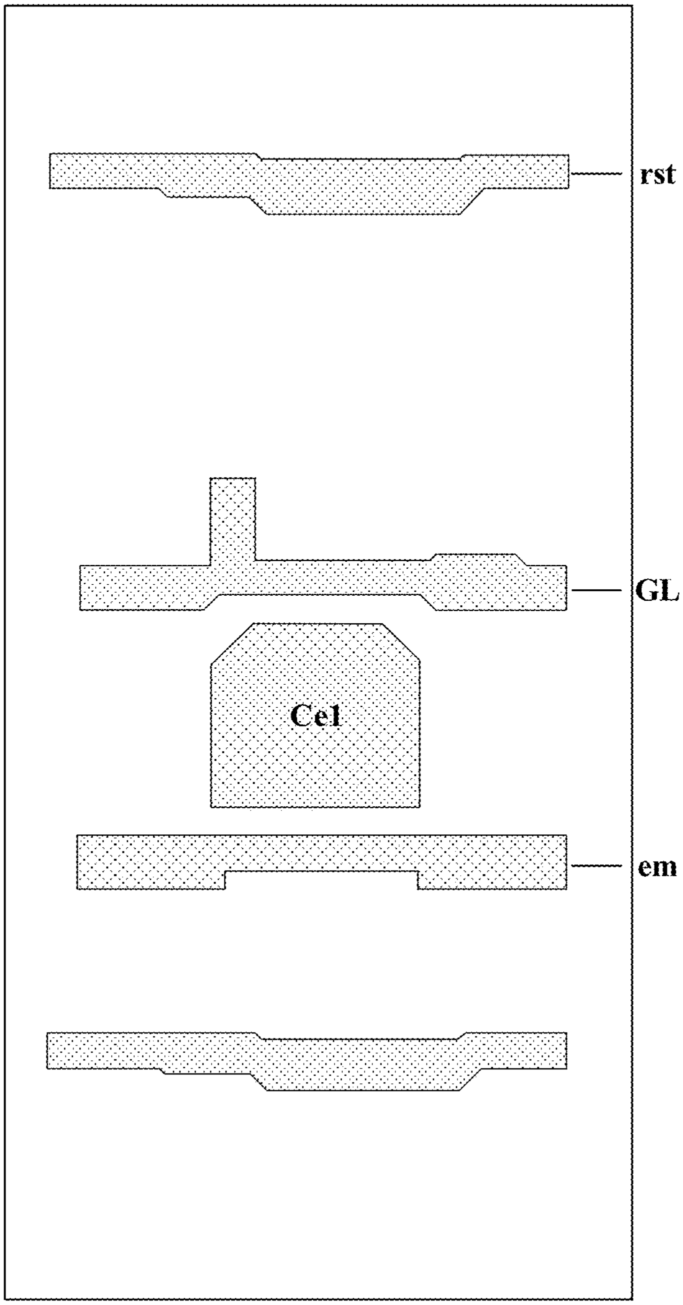
FIG. 4C illustrates the structure of a first conductive layer in an array substrate depicted in FIG. 4A.
Figure 4D:
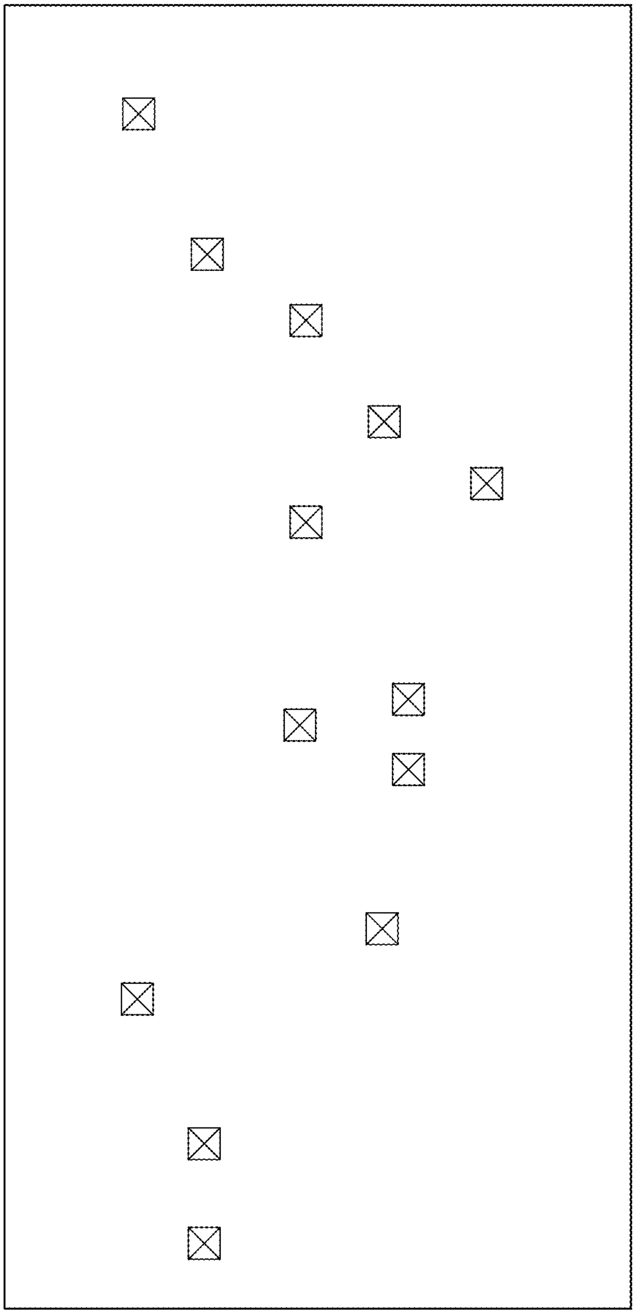
FIG. 4D illustrates the structure of an insulating layer in an array substrate depicted in FIG. 4A.
Figure 4E:
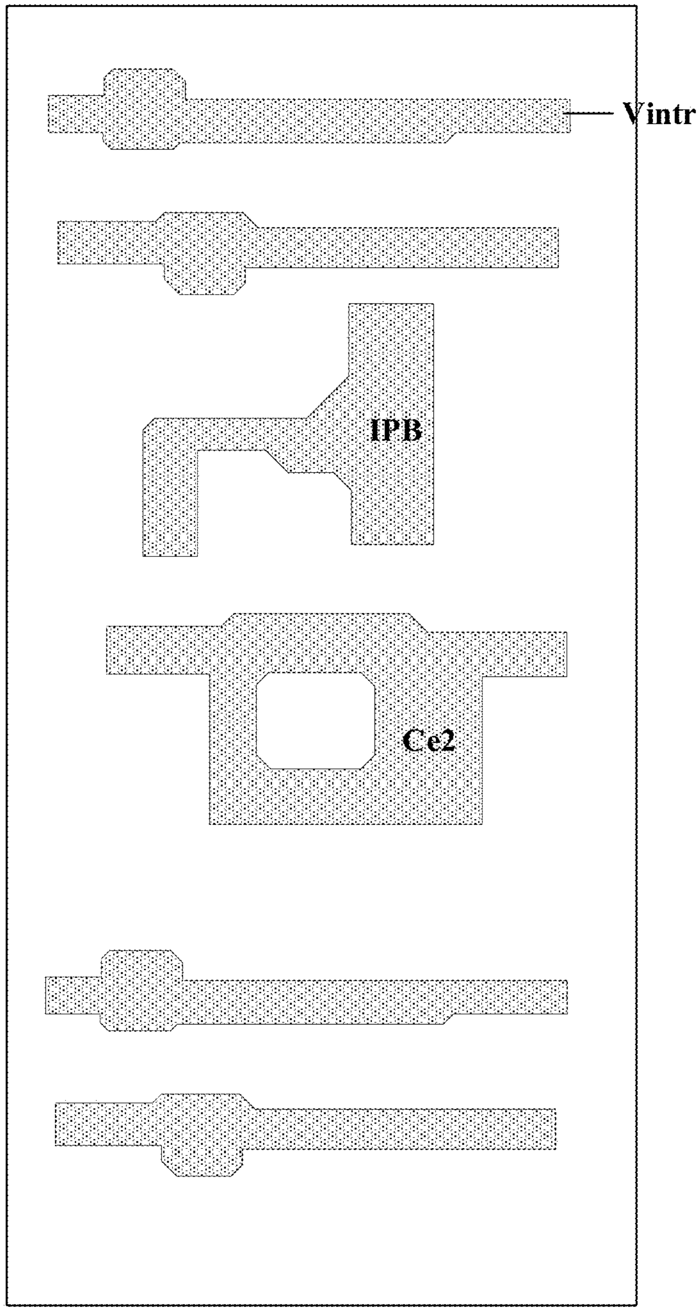
FIG. 4E illustrates the structure of a second conductive layer in an array substrate depicted in FIG. 4A.
Figure 4F:
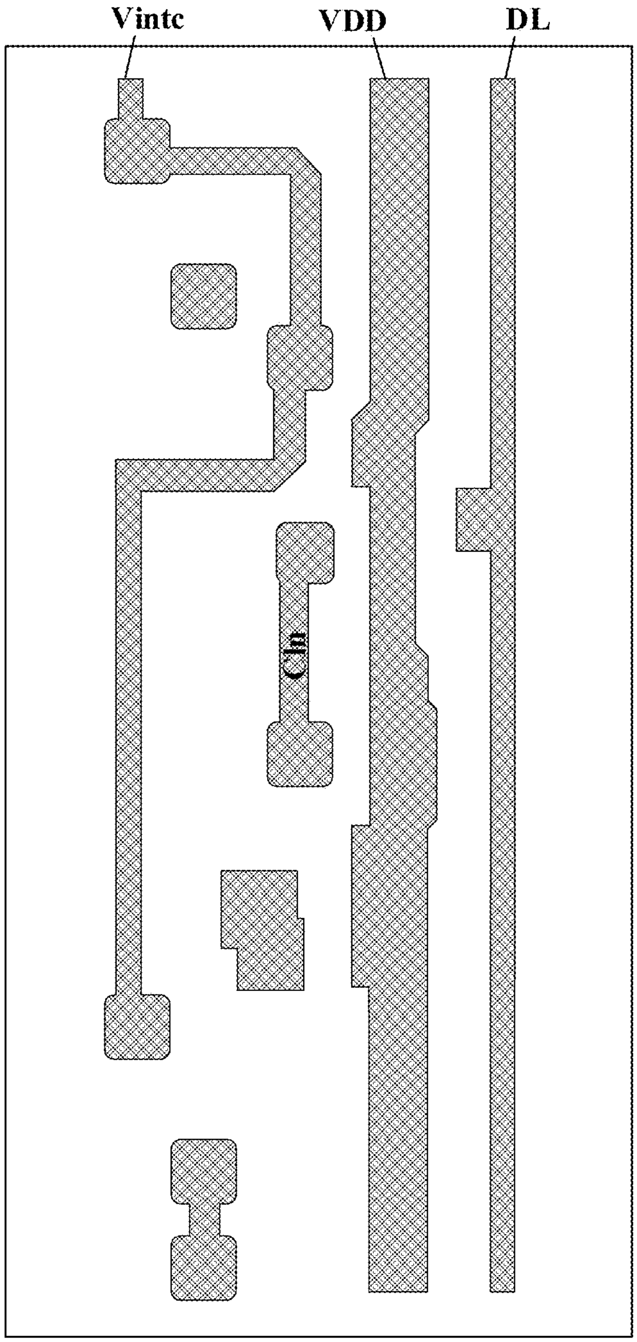
FIG. 4F illustrates the structure of a first signal layer in an array substrate depicted in FIG. 4A.
Figure 4G:
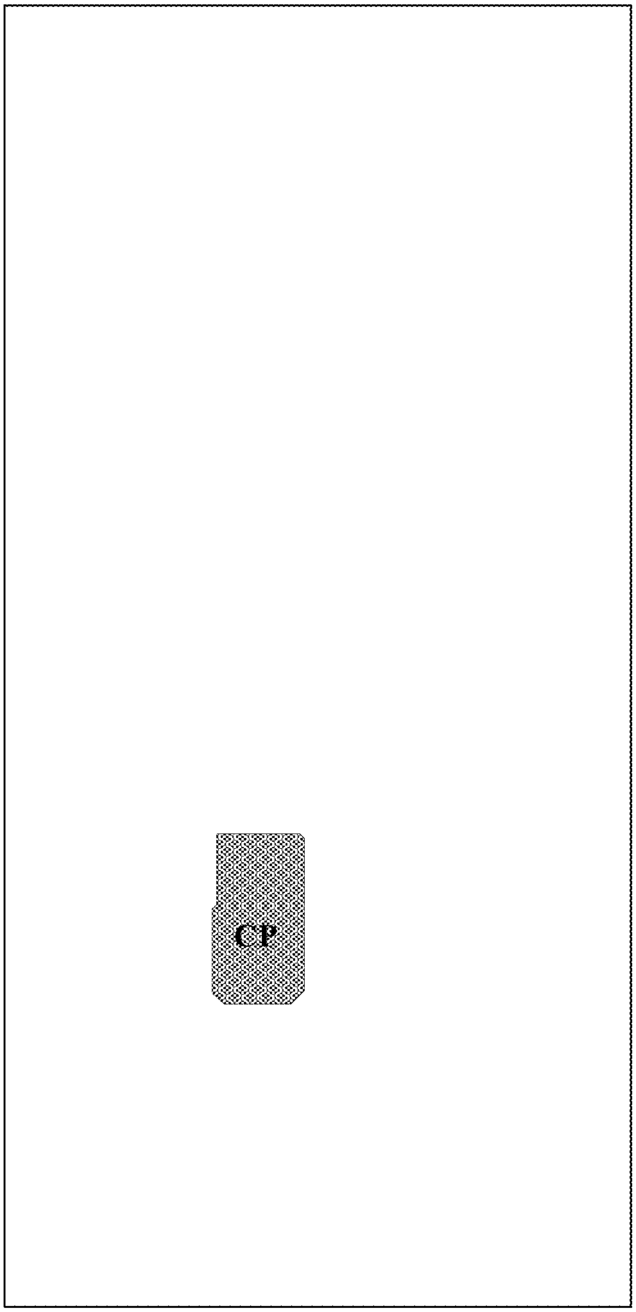
FIG. 4G illustrates the structure of a second signal layer in an array substrate depicted in FIG. 4A.
Figure 4H:
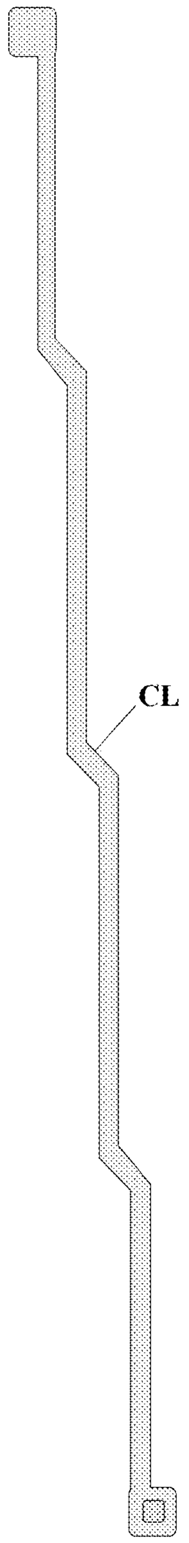
FIG. 4H illustrates the structure of a third signal layer in an array substrate depicted in FIG. 4A.
Figure 4I:
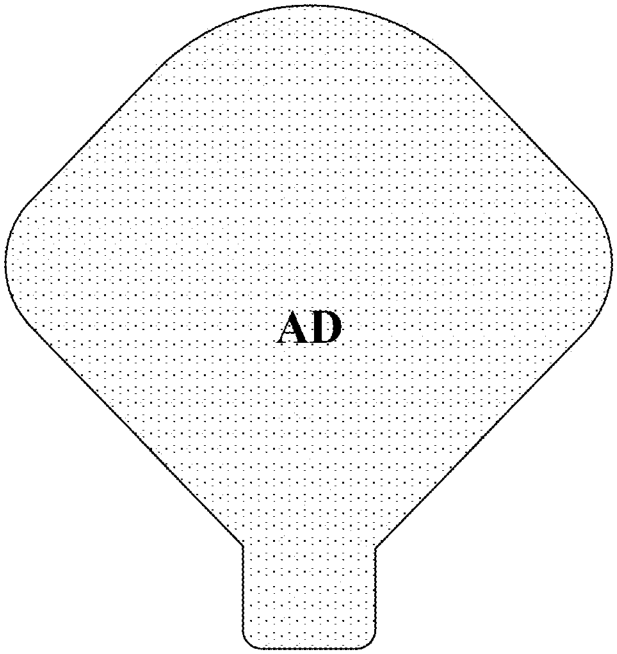
FIG. 4I illustrates the structure of an anode layer in an array substrate depicted in FIG. 4A.
Figure 4J:
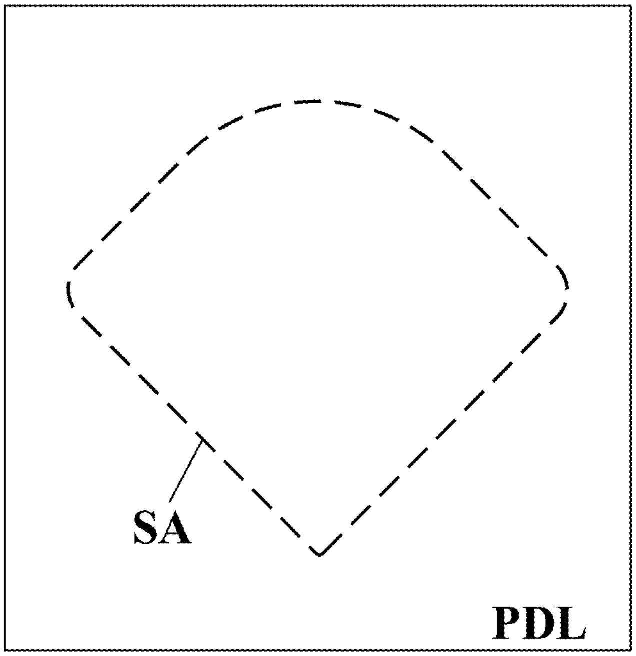
FIG. 4J illustrates the structure of a pixel definition layer in an array substrate depicted in FIG. 4A.
Figure 4K:
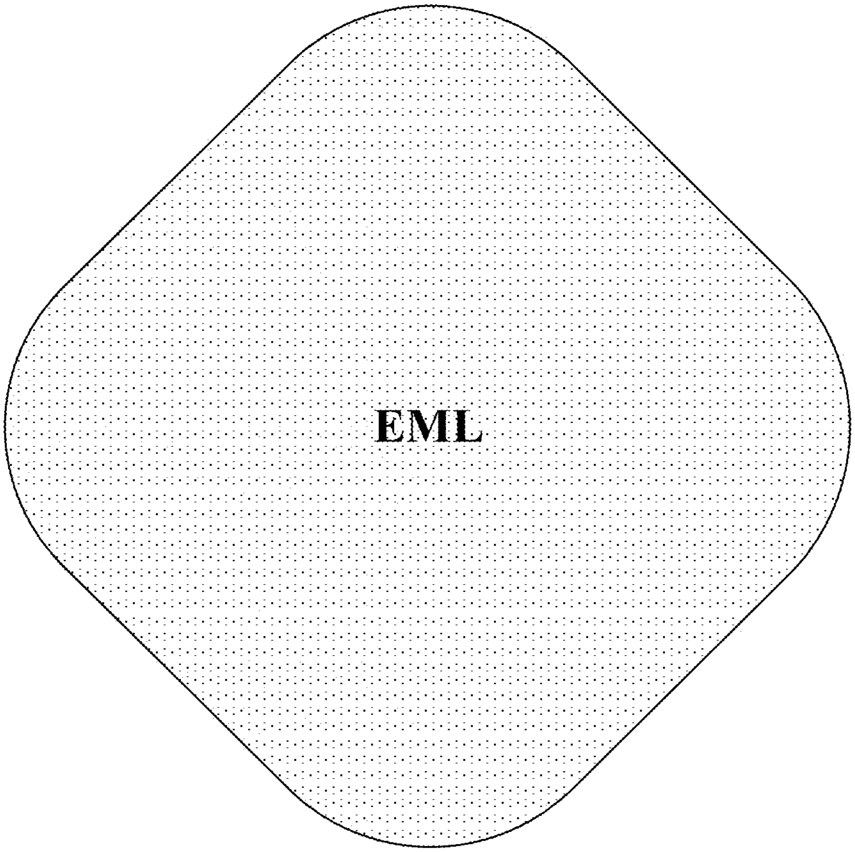
FIG. 4K illustrates the structure of a light emitting layer in an array substrate depicted in FIG. 4A.
Figure 5A:
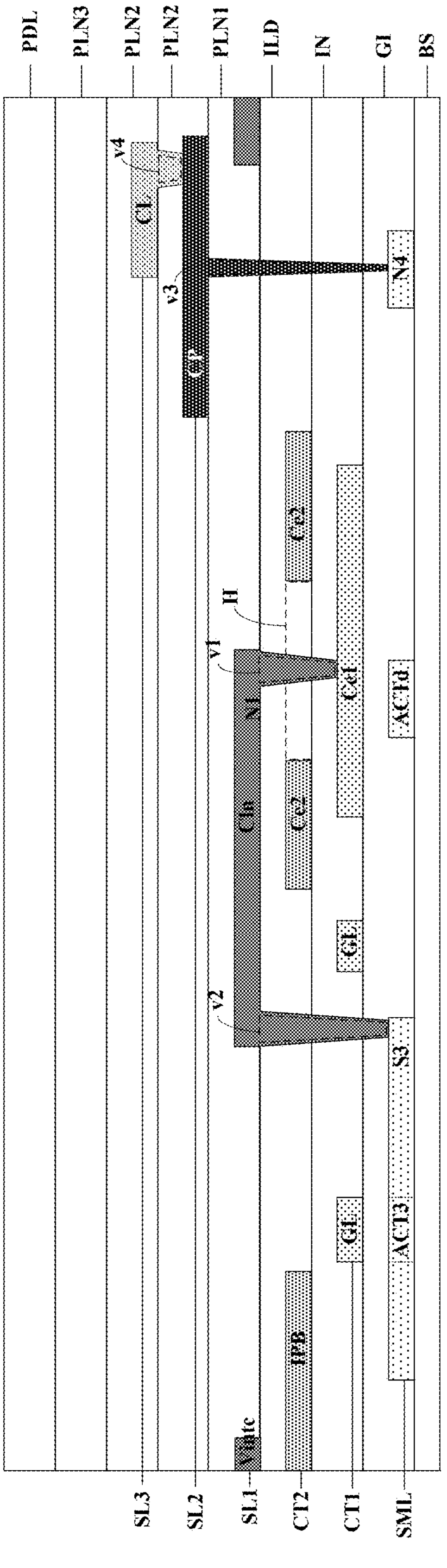
FIG. 5A is a cross-sectional view along an A-A' line in FIG. 4A.
Figure 5B:
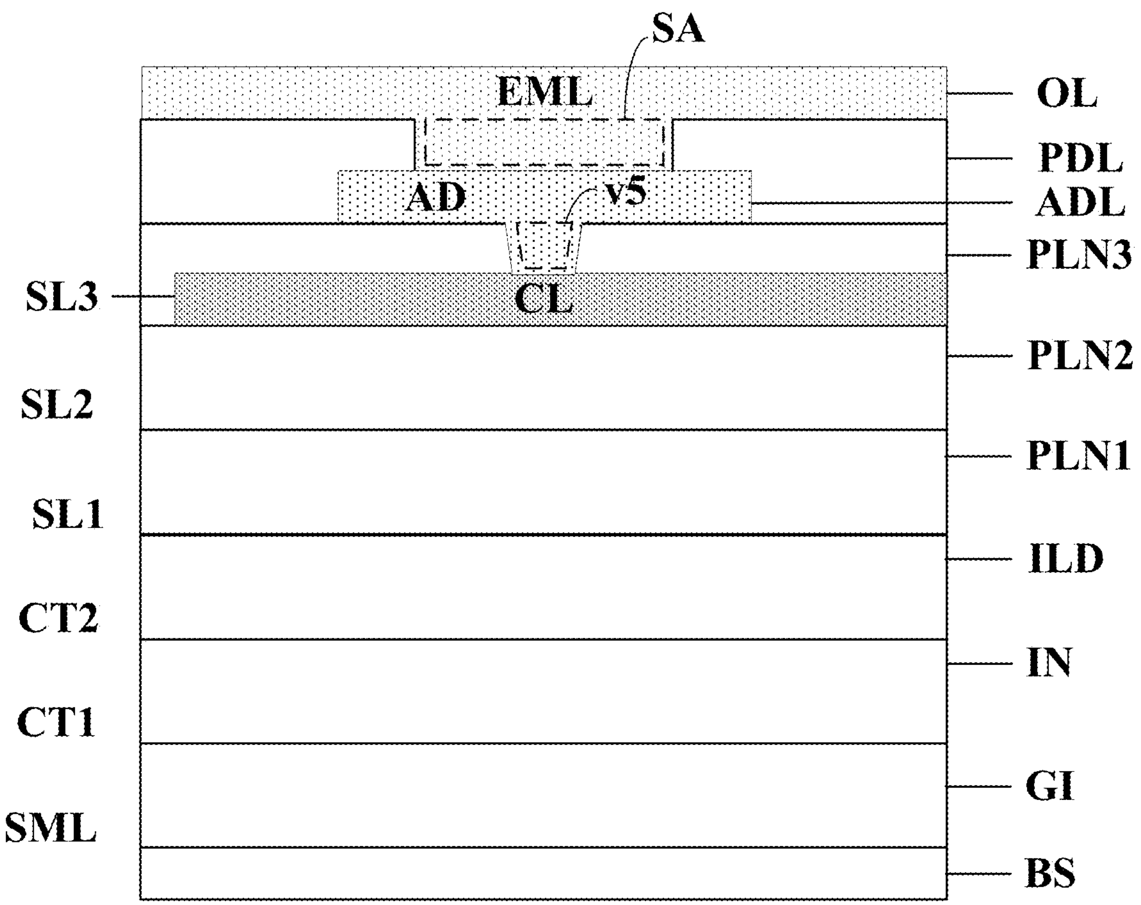
FIG. 5B is a cross-sectional view along a B-B' line in FIG. 4A.

FIG. 4A illustrates the structure of a respective pixel driving circuit and a respective light emitting element in some embodiments according to the present disclosure. FIG. 4B illustrates the structure of a semiconductor material layer in an array substrate depicted in FIG. 4A. FIG. 4C illustrates the structure of a first conductive layer in an array substrate depicted in FIG. 4A. FIG. 4D illustrates the structure of an insulating layer in an array substrate depicted in FIG. 4A. FIG. 4E illustrates the structure of a second conductive layer in an array substrate depicted in FIG. 4A. FIG. 4F illustrates the structure of a first signal layer in an array substrate depicted in FIG. 4A. FIG. 4G illustrates the structure of a second signal layer in an array substrate depicted in FIG. 4A. FIG. 4H illustrates the structure of a third signal layer in an array substrate depicted in FIG. 4A. FIG. 4I illustrates the structure of an anode layer in an array substrate depicted in FIG. 4A. FIG. 4J illustrates the structure of a pixel definition layer in an array substrate depicted in FIG. 4A. FIG. 4K illustrates the structure of a light emitting layer in an array substrate depicted in FIG. 4A. FIG. 5A is a cross-sectional view along an A-A' line in FIG. 4A. FIG. 5B is a cross-sectional view along a B-B' line in FIG. 4A.

Referring to FIG. 4A to FIG. 4K, FIG. 5A, and FIG. 5B, in some embodiments, the array substrate includes a base substrate BS, a semiconductor material layer SML on the base substrate BS, a gate insulating layer GI on a side of the semiconductor material layer SML away from the base substrate BS, a first conductive layer CT1 on a side of the gate insulating layer GI away from the semiconductor material layer SML, an insulating layer IN on a side of the first conductive layer away from the gate insulating layer GI, a second conductive layer CT2 on a side of the insulating layer IN away from the first conductive layer CT1, an inter-layer dielectric layer ILD on a side of the second conductive layer CT2 away from the insulating layer IN, a first signal line layer SL1 on a side of the inter-layer dielectric layer ILD away from the second conductive layer CT2, a first planarization layer PLN1 on a side of the first signal line layer SL1 away from the inter-layer dielectric layer ILD, a second signal line layer SL2 on a side of the first planarization layer PLN1 away from the first signal line layer SL1, a second planarization layer PLN2 on a side of the second signal line layer SL2 away from the first planarization layer PLN1, a third signal line layer SL3 on a side of the second planarization layer PLN2 away from the second signal line layer SL2, a third planarization layer PLN3 on a side of the third signal line layer SL3 away from the second planarization layer PLN2, an anode layer ADL on a side of the third planarization layer PLN3 away from the third signal line layer SL3, a pixel definition layer PDL on a side of the anode layer ADL away from the third planarization layer PLN3, and a light emitting layer EML on a side of the pixel definition layer PDL away from the anode layer ADL.

Referring to FIG. 4A to FIG. 4K, the semiconductor material layer SML in some embodiments includes active layers of the transistors, including active layers of the first transistor T1, the second transistor T2, the third transistor T3, the fourth transistor T4, the fifth transistor T5, the sixth transistor T6, and the driving transistor Td. Various appropriate semiconductor materials may be used for making the semiconductor material layer SML. Examples of appropriate semiconductor materials for making the semiconductor material layer SML include polycrystalline silicon, amorphous silicon, and metal oxides.

The first conductive layer CT1 in some embodiments includes a plurality of gate lines GL, a plurality of reset control signal lines rst, a plurality of light emitting control signal lines em, and a first capacitor electrode Ce1 of the storage capacitor Cst.

Vias extending through an insulating layer IN are depicted in FIG. 4D.

The second conductive layer CT2 in some embodiments includes an interference preventing block IPB, a second capacitor electrode Ce2 of the storage capacitor Cst, and a plurality of first reset signal lines Vintr. The interference preventing block IPB can effectively reduce crosstalk, particularly vertical crosstalk between the N1 node of the adjacent data lines.

The first signal line layer SL1 in some embodiments includes a plurality of voltage supply lines Vdd, a node connecting line Cln, a plurality of second reset signal lines Vintc, and a plurality of data lines DL. The node connecting line Cln connects the first capacitor electrode Ce1 and the drain electrode of the third transistor T3 in a respective pixel driving circuit together. The array substrate further includes a first via v1 in the hole region H and extending through the inter-layer dielectric layer ILD and the insulating layer IN. Optionally, the node connecting line Cln is connected to the first capacitor electrode Ce1 through the first via v1. In some embodiments, the first capacitor electrode Ce1 is on a side of the gate insulating layer IN away from the base substrate BS. Optionally, the array substrate further includes a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer GI. Optionally, the node connecting line Cln is connected to the first capacitor electrode Ce1 through the first via v1, and is connected to the semiconductor material layer SML through the second via v2. Optionally, the node connecting line Cln is connected to the drain electrode D3 of third transistor, as depicted in FIG. 4A.

The second signal line layer SL2 in some embodiments includes a connecting pad CP, through which the N4 node is electrically connected to an anode of the respective light emitting element. Optionally, the array substrate further includes a third via v3 extending through the first planarization layer PLN1, the inter-layer dielectric layer ILD, the insulating layer IN, and the gate insulating layer GI. The connecting pad CP is connected to the N4 node through the third via v3.

The third signal line layer SL3 in some embodiments includes a plurality of connecting lines CL. A respective connecting line of the plurality of connecting lines CL electrically connects the connecting pad CP to an anode of the respective light emitting element. Optionally, the array substrate further includes a fourth via v4 extending through the second planarization layer PLN2. A respective connecting line of the plurality of connecting lines CL is connected to the connecting pad CP through the fourth via v4. Various appropriate conductive materials may be used for making the plurality of connecting lines CL. Examples of appropriate conductive materials for making the plurality of connecting lines CL include conductive metal oxides such as indium tin oxide.

The anode layer includes a plurality of anodes AD of a plurality of light emitting elements, respectively. A respective anode of the plurality of anodes AD is connected to a respective connecting line. Optionally, the array substrate further includes a fifth via v5 extending through the third planarization layer PLN3. The respective anode is connected to the respective connecting line through the fifth via v5.

The pixel definition layer PDL defines a plurality of subpixel apertures SA.

The organic layer OL in some embodiments includes a plurality of light emitting layer EML of a plurality of light emitting elements, respectively. A respective light emitting layer of the plurality of light emitting layer EML is electrically connected to a respective anode of the plurality of anodes AD.

The plurality of connecting lines CL may be disposed in various appropriate layers. In some embodiments, the plurality of connecting lines CL are all in a same layer. In some embodiments, the plurality of connecting lines CL may be disposed in multiple layers. In one example, two adjacent connecting lines extending substantially along the column direction may be disposed in two different layers.

In one example, the plurality of connecting lines CL are in a third signal line layer SL3; the second planarization layer PLN2 is on a side of the third signal line layer SL3 closer to a base substrate BS; the third planarization layer PLN3 is on a side of the third signal line layer SL3 away from the base substrate BS; the anode layer ADL is on a side of the third planarization layer PLN3 away from the third signal line layer SL3; and the plurality of pixel driving circuits PDC are on a side of the second planarization layer PLN2 away from the third signal line layer SL3.

Figure 6A:
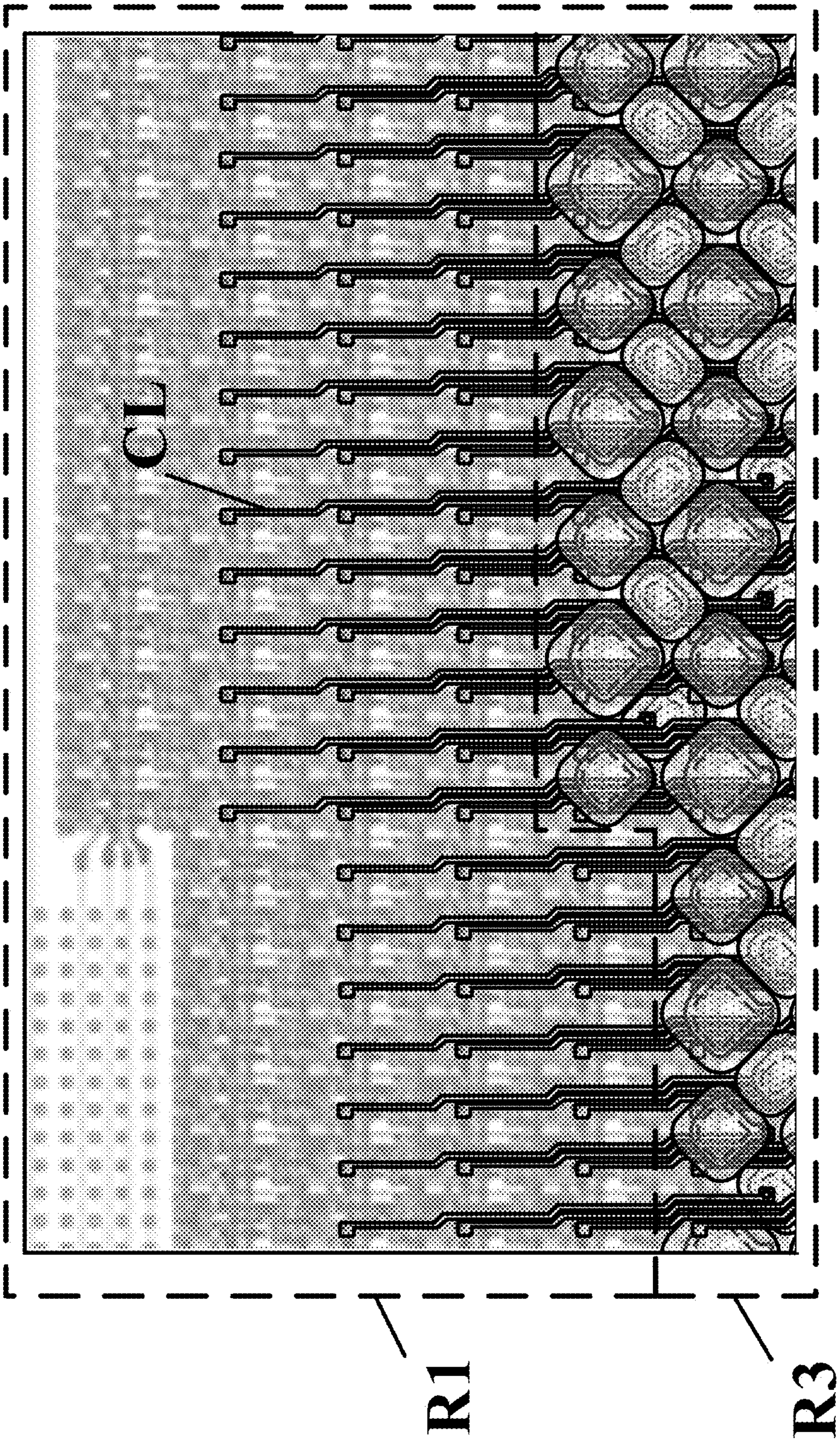
FIG. 6A illustrates the structure of an array substrate in a first region in some embodiments according to the present disclosure.
Figure 6B:
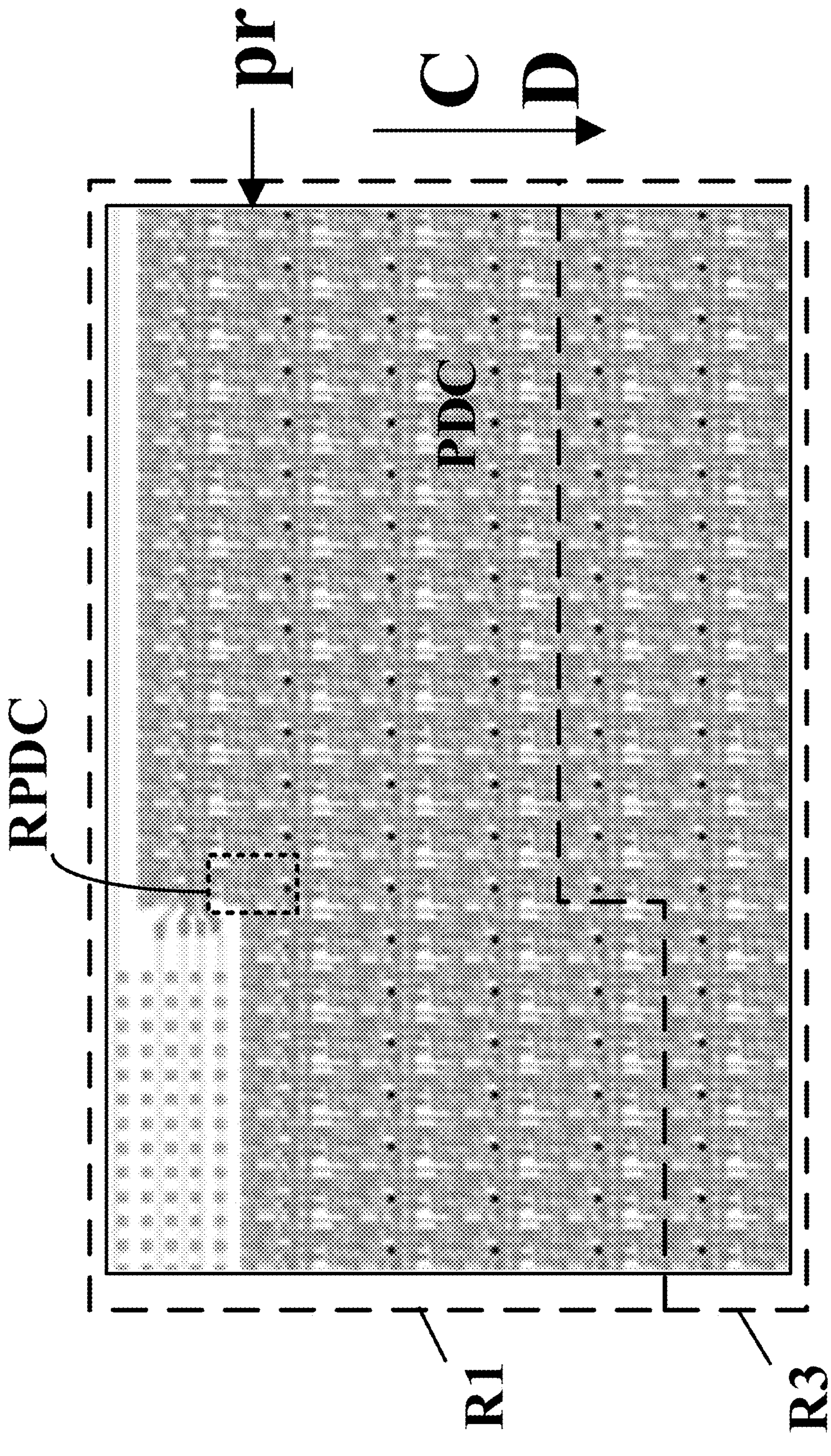
FIG. 6B illustrates the structure of pixel driving circuits in FIG. 6A.
Figure 6C:
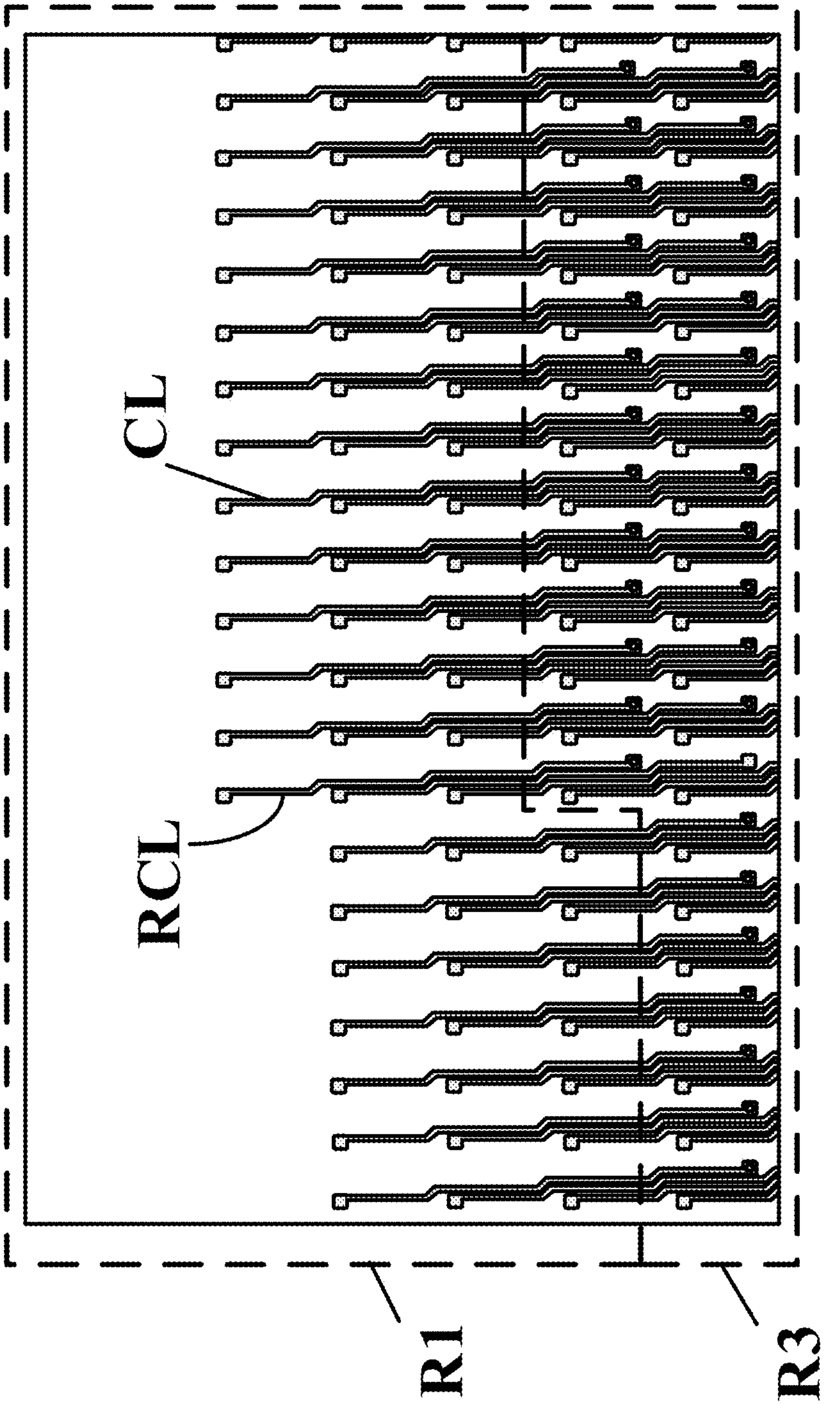
FIG. 6C illustrates the structure of connecting lines in FIG. 6A.
Figure 6D:
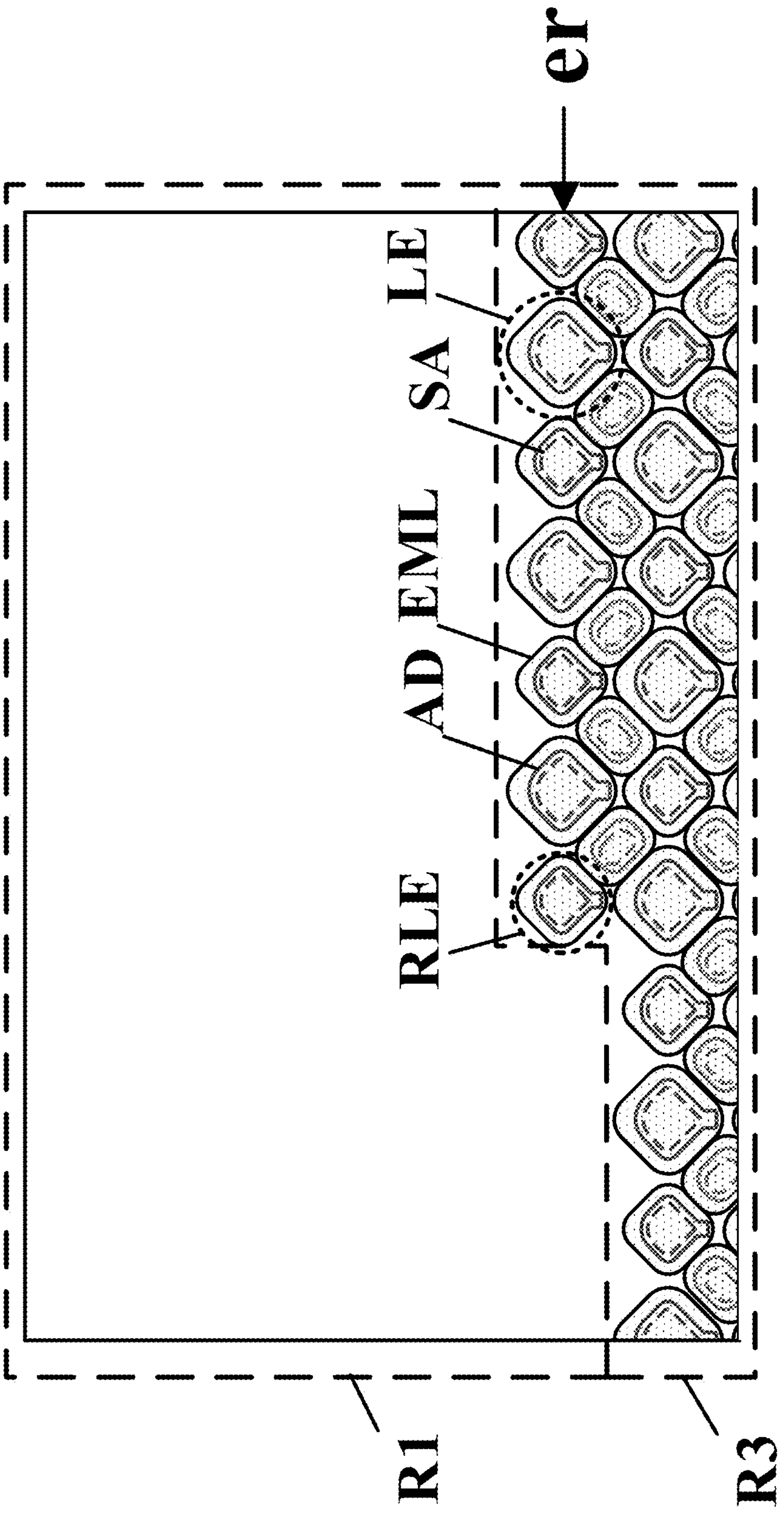
FIG. 6D illustrates the structure of light emitting elements in FIG. 6A.
Figure 7A:
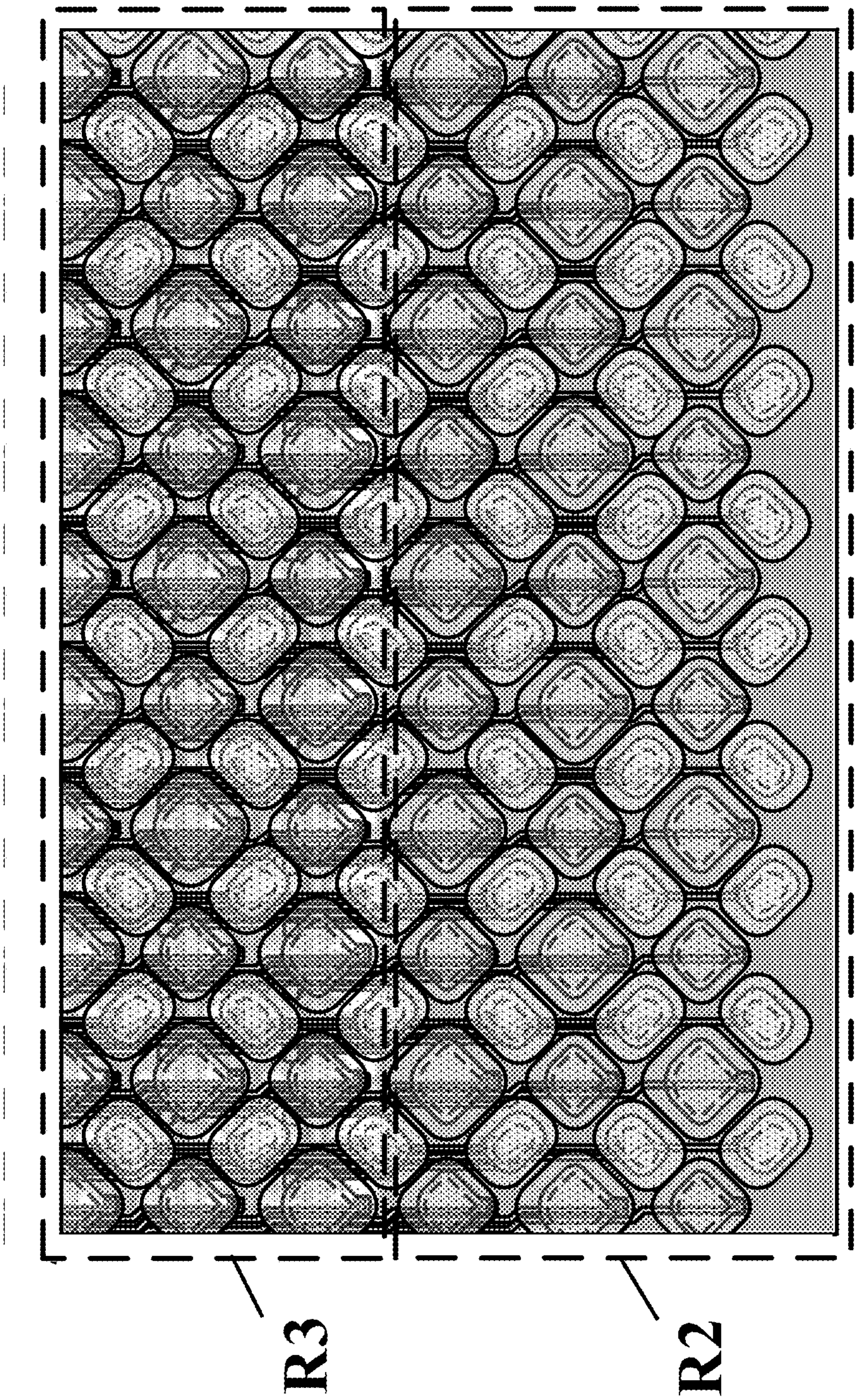
FIG. 7A illustrates the structure of an array substrate in a second region in some embodiments according to the present disclosure.
Figure 7B:
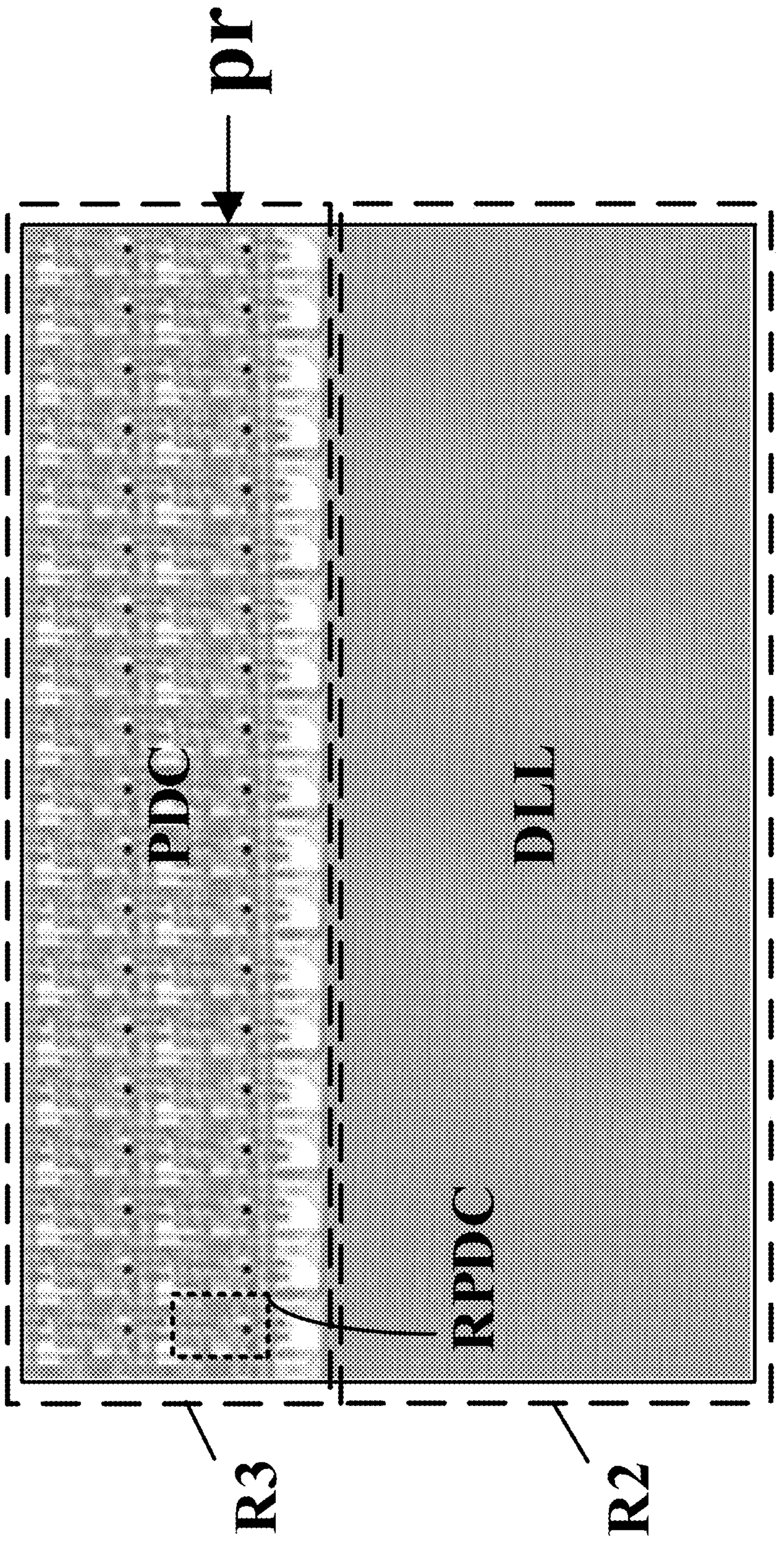
FIG. 7B illustrates the structure of pixel driving circuits in FIG. 7A.
Figure 7C:
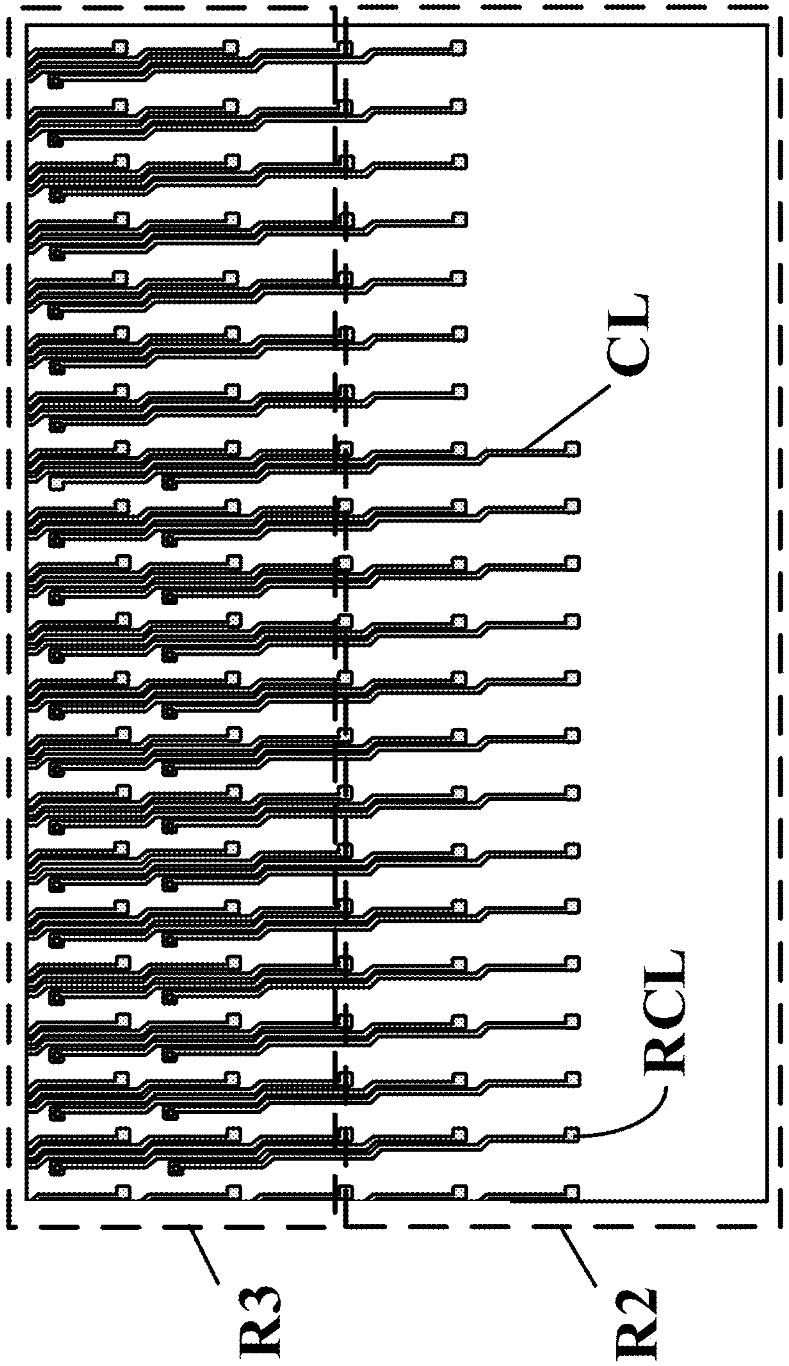
FIG. 7C illustrates the structure of connecting lines in FIG. 7A.

FIG. 6A illustrates the structure of an array substrate in a first region in some embodiments according to the present disclosure. FIG. 6B illustrates the structure of pixel driving circuits in FIG. 6A. FIG. 6C illustrates the structure of connecting lines in FIG. 6A. FIG. 6D illustrates the structure of light emitting elements in FIG. 6A. FIG. 7A illustrates the structure of an array substrate in a second region in some embodiments according to the present disclosure. FIG. 7B illustrates the structure of pixel driving circuits in FIG. 7A. FIG. 7C illustrates the structure of connecting lines in FIG.

Figure 7D:
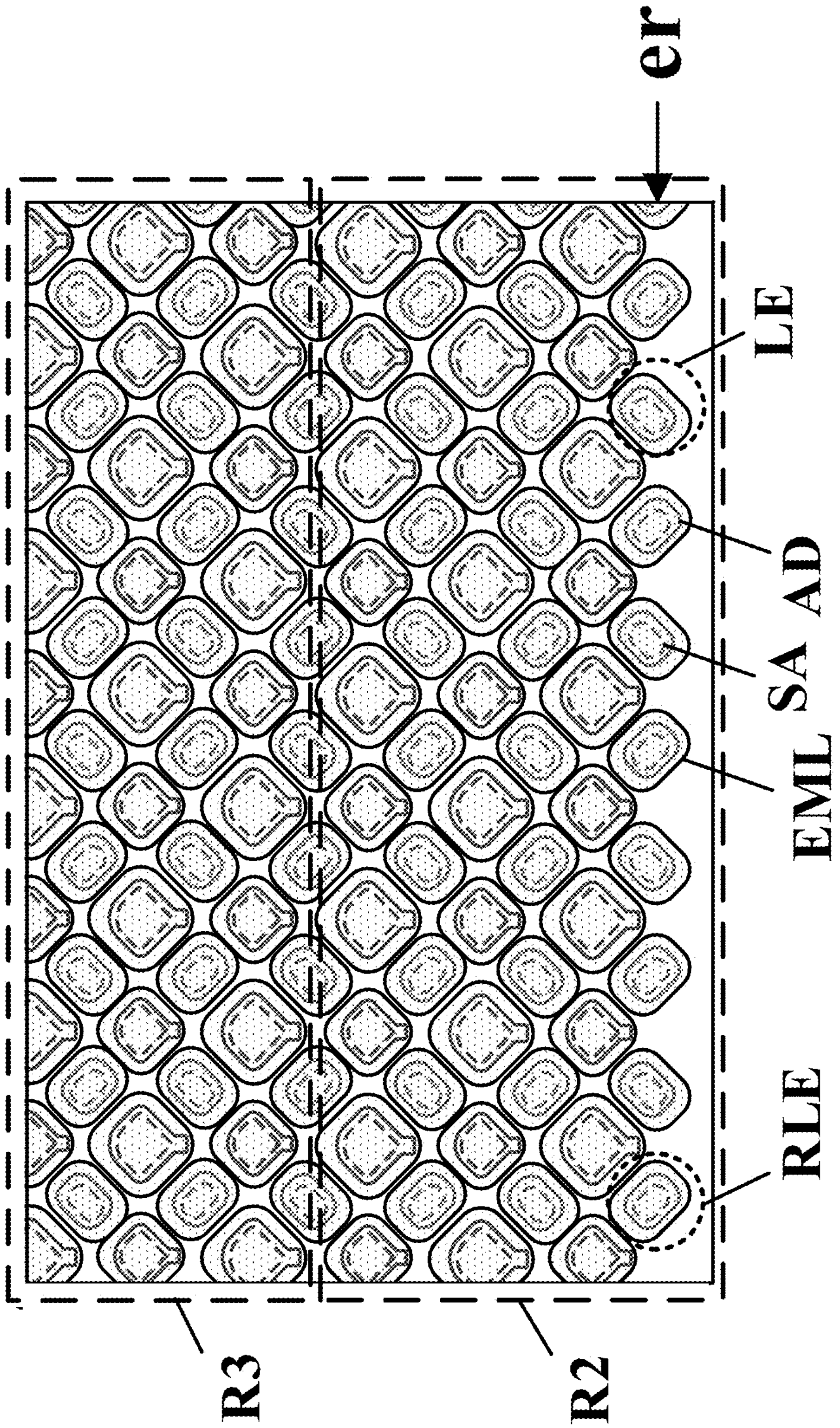
FIG. 7D illustrates the structure of light emitting elements in FIG. 7A.

7A. FIG. 7D illustrates the structure of light emitting elements in FIG. 7A. Referring to FIG. 6A to FIG. 6D, and FIG. 7A to FIG. 7D, in a first region R1, at least transistors and capacitors of multiple pixel driving circuits of the plurality of pixel driving circuits PDC are present, and the plurality of light emitting elements LE are absent. In a second region R2, multiple light emitting elements of the plurality of light emitting elements LE are present, and transistors and capacitors of the plurality of pixel driving circuits PDC are absent. Optionally, in the first region R1, transistors and capacitors of at least one row of pixel driving circuits are present, and the plurality of light emitting elements LE are absent. Optionally, in the second region R2, at least one row of light emitting elements are present, and transistors and capacitors of the plurality of pixel driving circuits PDC are absent.

In some embodiments, referring to FIG. 1, FIG. 6A to FIG. 6D, and FIG. 7A to FIG. 7D, the first region R1 and the second region R2 are on two sides of a third region R3. Optionally, in the third region R3, multiple rows of light emitting elements and transistors and capacitors of multiple rows of pixel driving circuits are present. The array substrate includes a light emitting area LEA, in which the array substrate is configured to emit light. The light emitting area LEA includes the second region R2. The first region R1 is not part of the light emitting area LEA. The array substrate includes a driving circuit area DCA. The driving circuit area DCA includes the first region R1. The second region R2 is not part of the driving circuit area DCA. The shortest distance between the first region R1 and the second region R2 is greater than 50% (e.g., greater than 60%, greater than 70%, greater than 80%, greater than 90%, or greater than 95%) of a total length of the light emitting area LEA along a direction from the first region R1 to the second region R2.

In some embodiments, the array substrate further includes a third region R3. The third region R3 spaces apart the first region R1 and the second region R2. Multiple rows of light emitting elements and transistors and capacitors of multiple rows of pixel driving circuit are present in the third region R3. The driving circuit area DCA and the light emitting area LEA overlap with each other in the third region R3. In one example, the first region R1, the third region R3, and the second region R2 are sequentially arranged from one side of the array substrate to another side of the array substrate.

In some embodiments, the array substrate further includes a peripheral region surrounding a combination of the first region R1, the second region R2, and the third region R3. Optionally, the peripheral region includes a first peripheral sub-region PA1 on a first side S1, a second peripheral sub-region PA2 on a second side S2, a third peripheral sub-region PA3 on a third side S3, and a fourth peripheral sub-region PA4 on a fourth side S4. The peripheral region is absent of any light emitting elements and any pixel driving circuits. Optionally, the array substrate further includes a gate-on-array circuit in at least one of the third peripheral sub-region PA3 or the fourth peripheral sub-region PA4. In one example, the gate-on-array circuit is in the third peripheral sub-region PA3. In another example, the gate-on-array circuit is in the fourth peripheral sub-region PA4. In another example, the gate-on-array circuit is partially in the third peripheral sub-region PA3, and partially in the fourth peripheral sub-region PA4. Optionally, the first region R1 is on the first side S1, and the second region R2 is on the second side S2.

In one example, a margin of the first peripheral sub-region PA1 (e.g., a distance between an outer edge of the first peripheral sub-region PA1 and the first region R1) is in a range of 500 μm to 3000 μm. In another example, a margin of the second peripheral sub-region PA2 (e.g., a distance between an outer edge of the second peripheral sub-region PA2 and the second region R2) is in a range of 100 μm to 3000 μm. In another example, a difference between the margin of the first peripheral sub-region PA1 and the margin of the second peripheral sub-region PA2 is in a range of 0 μm to 3000 μm.

In some embodiments, the plurality of connecting lines CL connect the plurality of pixel driving circuits PDC with a plurality of corresponding light emitting elements, respectively. A respective connecting line RCL connects a respective pixel driving circuit RPDC with a respective light emitting element RLE.

Optionally, an orthographic projection of the respective connecting line RCL of the plurality of connecting lines CL on a base substrate intersects with an orthographic projection of at least one row (e.g., 1, 2, 3, 4, 5, more than 5, more than 10, more than 20) of pixel driving circuits other than the respective pixel driving circuit RPDC on the base substrate. A respective row of pixel driving circuits is denoted as pr.

Optionally, the respective connecting line RCL of the plurality of connecting lines CL cross over at least one row (e.g., 1, 2, 3, 4, 5, more than 5, more than 10, more than 20) of pixel driving circuits other than the respective pixel driving circuit RPDC. A respective row of pixel driving circuits is denoted as pr.

Optionally, an orthographic projection of the respective connecting line RCL of the plurality of connecting lines CL on a base substrate intersects with an orthographic projection of at least one row (e.g., 1, 2, 3, 4, 5, more than 5, more than 10, more than 20) of light emitting elements other than the respective light emitting element on the base substrate. A respective row of light emitting elements is denoted as er.

Optionally, the respective connecting line RCL of the plurality of connecting lines CL cross over at least one row (e.g., 1, 2, 3, 4, 5, more than 5, more than 10, more than 20) of light emitting elements other than the respective light emitting element. A respective row of light emitting elements is denoted as er.

In some embodiments, extension directions of the plurality of connecting lines CL are substantially parallel to each other. As used herein, the term "substantially parallel" means that an angle is in the range of 0 degree to approximately 45 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees. Optionally, the plurality of connecting lines extend along a direction from the first region R1 to the second region R2. Optionally, included angles between extension directions of the plurality of connecting lines are between 0 degree and 30 degrees.

In some embodiments, a respective connecting line of the plurality of connecting lines CL includes one or more portions parallel to a column direction CD and one or more portions non-parallel to the column direction CD. The column direction CD (see, e.g., FIG. 6B) is a direction along which a column of light emitting elements are arranged.

In some embodiments, referring to FIG. 1, FIG. 5A, FIG. 5B, FIG. 6A to FIG. 6D, and FIG. 7A to FIG. 7D, a respective connecting line of the plurality of connecting lines CL first extends, along a direction away from the base substrate BS toward a third planarization layer PLN3, through a fourth via v4 extending through the second planarization layer PLN2; then extends along a direction from the first region R1 to the second region R2 on a surface of the second planarization layer PLN2; and then extends, along a direction away from the base substrate BS toward a third planarization layer PLN3, through a fifth via v5 extending through the third planarization layer PLN3, thereby electrically connected to a respective light emitting element.

In some embodiments, the plurality of connecting lines CL are arranged in an array comprising rows and columns. Optionally, the array of connecting lines is at least partially present in the first region R1 and at least partially present in the second region R2. Optionally, the array of connecting lines extends from a portion of the first region R1, through the third region R3, and at least partially into the second region R2.

In some embodiments, a ratio of a total number of rows of connecting lines to a total number of rows of subpixels configured to emit light is in a range of 0.9 to 1.1 (e.g., 0.9 to 1.0, or 1.0 to 1.1, or 1.0), and a ratio of a total number of columns of connecting lines to a total number of columns of subpixels configured to emit light is in a range of 0.9 to 1.1 (e.g., 0.9 to 1.0, or 1.0 to 1.1, or 1.0). As used herein, the term "subpixels configured to emit light" excludes dummy subpixels that are not capable of emitting light. Optionally, a total number of rows of connecting lines is the same as a total number of rows of subpixels configured to emit light, and a total number of columns of connecting lines is the same as a total number of columns of subpixels configured to emit light. Optionally, a total number of rows of connecting lines is the same as a total number of rows of pixel driving circuits, and a total number of columns of connecting lines is the same as a total number of columns of pixel driving circuits. Optionally, a total number of rows of connecting lines is the same as a total number of rows of light emitting elements, and a total number of columns of connecting lines is the same as a total number of columns of light emitting elements. Optionally, a total number of rows of connecting lines is the same as a total number of rows of anodes in subpixels configured to emit light, and a total number of columns of connecting lines is the same as a total number of columns of anodes in subpixels configured to emit light. Optionally, a total number of rows of connecting lines is the same as a total number of rows of light emitting layers in subpixels configured to emit light, and a total number of columns of connecting lines is the same as a total number of columns of light emitting layers in subpixels configured to emit light.

In some embodiments, the subpixels configured to emit light are arrange in m rows and n columns; thus a total number of the subpixels configured to emit light is m*n. Optionally, the array substrate further includes a plurality of signal lines, for example, a plurality of first power supply lines (Vdd), a plurality of second power supply lines (Vss), a plurality of data lines, and a plurality of gate lines.

Optionally, a ratio of a total number of rows of connecting lines to a total number of gate lines is in a range of 0.9 to 1.1 (e.g., 0.9 to 1.0, or 1.0 to 1.1, or 1.0), and a ratio of a total number of columns of connecting lines to a total number of data lines is in a range of 0.9 to 1.1 (e.g., 0.9 to 1.0, or 1.0 to 1.1, or 1.0).

Optionally, a ratio of a total number of columns of connecting lines to a total number of first power supply lines is in a range of 0.9 to 1.1 (e.g., 0.9 to 1.0, or 1.0 to 1.1, or 1.0).

Optionally, a ratio of a total number of columns of connecting lines to a total number of second power supply lines is in a range of 0.9 to 1.1 (e.g., 0.9 to 1.0, or 1.0 to 1.1, or 1.0).

In some embodiments, referring to FIG. 6A to FIG. 6D, and FIG. 7A to FIG. 7D, multiple first connecting lines of the plurality of connecting lines CL connect the multiple pixel driving circuits in the first region R1 with multiple corresponding light emitting elements in the third region R3 between the first region R1 and the second region R2. Multiple second connecting lines of the plurality of connecting lines CL connect the multiple light emitting elements in the second region R2 with multiple corresponding pixel driving circuits in the third region R3.

In some embodiments, in the third region R3, an orthographic projection of an individual light emitting element of the plurality of light emitting elements LE on a base substrate at least partially overlaps with an orthographic projection of an individual pixel driving circuit of the plurality of pixel driving circuits PDC on the base substrate. The individual pixel driving circuit is configured to drive light emission in a light emitting element different from the individual light emitting element.

In some embodiments, in the third region R3, an orthographic projection of an individual light emitting layer of an individual light emitting element of the plurality of light emitting elements LE on a base substrate at least partially overlaps with an orthographic projection of an individual pixel driving circuit of the plurality of pixel driving circuits PDC on the base substrate. The individual pixel driving circuit is configured to drive light emission in a light emitting element different from the individual light emitting element.

In some embodiments, in the third region R3, an orthographic projection of an individual anode of an individual light emitting element of the plurality of light emitting elements LE on a base substrate at least partially overlaps with an orthographic projection of an individual pixel driving circuit of the plurality of pixel driving circuits PDC on the base substrate. The individual pixel driving circuit is configured to drive light emission in a light emitting element different from the individual light emitting element.

In some embodiments, an orthographic projection of a respective light emitting element RLE of the plurality of light emitting elements LE on a base substrate is non-overlapping with an orthographic projection of a corresponding pixel driving circuit (e.g., RPDC) of the plurality of pixel driving circuits PDC on the base substrate. The corresponding pixel driving circuit configured to drive light emission in the respective light emitting element RLE.

In some embodiments, referring to FIG. 6C, orthographic projections of the plurality of connecting lines CL on a plane parallel to the column direction CD and perpendicular to the base substrate at least partially overlap with each other. The plurality of connecting lines CL extend on the display panel without intersecting each other.

In some embodiments, a distance between the respective light emitting element RLE of the plurality of light emitting elements LE and the corresponding pixel driving circuit (e.g., RPDC) of the plurality of pixel driving circuits PDC is in a range of 0 μm to 5000 μm. In one example, a subpixel has a size of x*y; the plurality of connecting lines CL are disposed in z number of layers, z being an integer≥1; a line width of the connecting line is a; a distance between adjacent connecting lines is b; a maximum width of a fourth via through which a respective connecting line is connected to the connecting pad CP is c; and a maximum number of connecting lines passing through the subpixel in a third region R3 is approximately a round off integer value of $N=z*[(x-c)-b]/(a+b)$. In another example, the distance between the respective light emitting element RLE of the plurality of light emitting elements LE and the corresponding pixel driving circuit of the plurality of pixel driving circuits PDC is defined as $0 \leq d \leq y*N = y*z*[(x-c)-b]/(a+b)$.

In some embodiments, a length of the respective connecting line of the plurality of connecting lines CL is approximately N*y.

In some embodiments, the array substrate includes a plurality of groups of connecting lines, a respective group of the plurality of groups of connecting lines includes N number of connecting lines. An intra-group distance between two adjacent connecting lines in a same group of connecting lines is ≥b. An inter-group distance between two adjacent connecting lines respectively from two adjacent groups of connecting lines is ≥(b*2)+c.

In some embodiments, orthographic projections of any electrically connected pair of pixel driving circuit and light emitting element on a base substrate are non-overlapping. Any pair of pixel driving circuit and light emitting element having overlapping orthographic projections on the base substrate are electrically separated. Optionally, orthographic projections of any pair of pixel driving circuit and light emitting element belonging to a same subpixel on a base substrate are non-overlapping. Any pair of pixel driving circuit and light emitting element having overlapping orthographic projections on the base substrate belong to different subpixels.

In some embodiments, an orthographic projection of a respective light emitting layer of a respective light emitting element RLE of the plurality of light emitting elements LE on a base substrate is non-overlapping with an orthographic projection of a corresponding pixel driving circuit (e.g., RPDC) of the plurality of pixel driving circuits PDC on the base substrate. The corresponding pixel driving circuit configured to drive light emission in the respective light emitting element RLE.

In some embodiments, orthographic projections of any electrically connected pair of pixel driving circuit and light emitting layer on a base substrate are non-overlapping. Any pair of pixel driving circuit and light emitting layer having overlapping orthographic projections on the base substrate are electrically separated. Optionally, orthographic projections of any pair of pixel driving circuit and light emitting layer belonging to a same subpixel on a base substrate are non-overlapping. Any pair of pixel driving circuit and light emitting layer having overlapping orthographic projections on the base substrate belong to different subpixels.

In some embodiments, an orthographic projection of a respective anode of a respective light emitting element RLE of the plurality of light emitting elements LE on a base substrate is non-overlapping with an orthographic projection of a corresponding pixel driving circuit (e.g., RPDC) of the plurality of pixel driving circuits PDC on the base substrate. The corresponding pixel driving circuit configured to drive light emission in the respective light emitting element RLE.

In some embodiments, orthographic projections of any electrically connected pair of pixel driving circuit and anode on a base substrate are non-overlapping. Any pair of pixel driving circuit and anode having overlapping orthographic projections on the base substrate are electrically separated. Optionally, orthographic projections of any pair of pixel driving circuit and anode belonging to a same subpixel on a base substrate are non-overlapping. Any pair of pixel driving circuit and anode having overlapping orthographic projections on the base substrate belong to different subpixels.

Referring to FIG. 3, FIG. 4A to FIG. 4K, and FIG. 7A to FIG. 7D, the array substrate in some embodiments further includes a plurality of data lines DL at least partially in the third region R3 and a plurality of data lead lines DLL in the second region R2. The plurality of data lead lines DLL are in a region absent of transistors and capacitors of the plurality of pixel driving circuits (e.g., the second region R2), multiple light emitting elements of the plurality of light emitting elements may be present in the region having the plurality of data lead lines DLL. The plurality of data lead lines DLL electrically connect the plurality of data lines DL to an integrated circuit IC. A boundary between the plurality of data lines DL and the plurality of data lead lines DLL may be a virtual line. On a first side of the virtual line having the plurality of data lines DL, transistors and capacitors of the plurality of pixel driving circuits are present. On a second side of the virtual line having the plurality of data lines DL, transistors and capacitors of the plurality of pixel driving circuits are absent.

In some embodiments, an orthographic projection of the multiple light emitting elements in the second region R2 on the base substrate at least partially overlaps with an orthographic projection of the plurality of data lead lines DLL on a base substrate. By having the intricate structure, the bezel of the array substrate can be made narrower, increasing the display area for the array substrate.

In some embodiments, the plurality of data lead lines DLL are in a fanout area of the second region R2. Extension direction of at least some data lead lines of the plurality of data lead lines DLL are different from extension direction of the plurality of data lines DL. In one example, the plurality of data lines DL extend along a column direction CD (see, e.g., FIG. 6B). In another example, a respective data lead line of the plurality of data lead lines DLL extends from a connection point with a respective data line of the plurality of data lines DL to the integrated circuit IC. In another example, a boundary between the plurality of data lines DL and the plurality of data lead lines DLL may be a virtual line connecting connection points where extension directions of the plurality of data lines DL change to extension directions of the plurality of data lead lines DLL.

In some embodiments, the integrated circuit IC is in a peripheral region of the array substrate having the second region R.

Referring to FIG. 1 and FIG. 3, in one example, a distance between the light emitting area LEA and the integrated circuit IC is in a range of 1000 μm to 10000 μm.

In one example, the plurality of data lead lines DLL and the plurality of data lines DL are in a same layer and, optionally, are made of a same material and formed in a same patterning process.

In another example, at least a portion of a respective data lead line of the plurality of data lead lines DLL is in a layer different from that of the plurality of data lines DL.

In another example, the plurality of data lead lines DLL are in a layer different from that of the plurality of data lines DL.

Figure 8A:
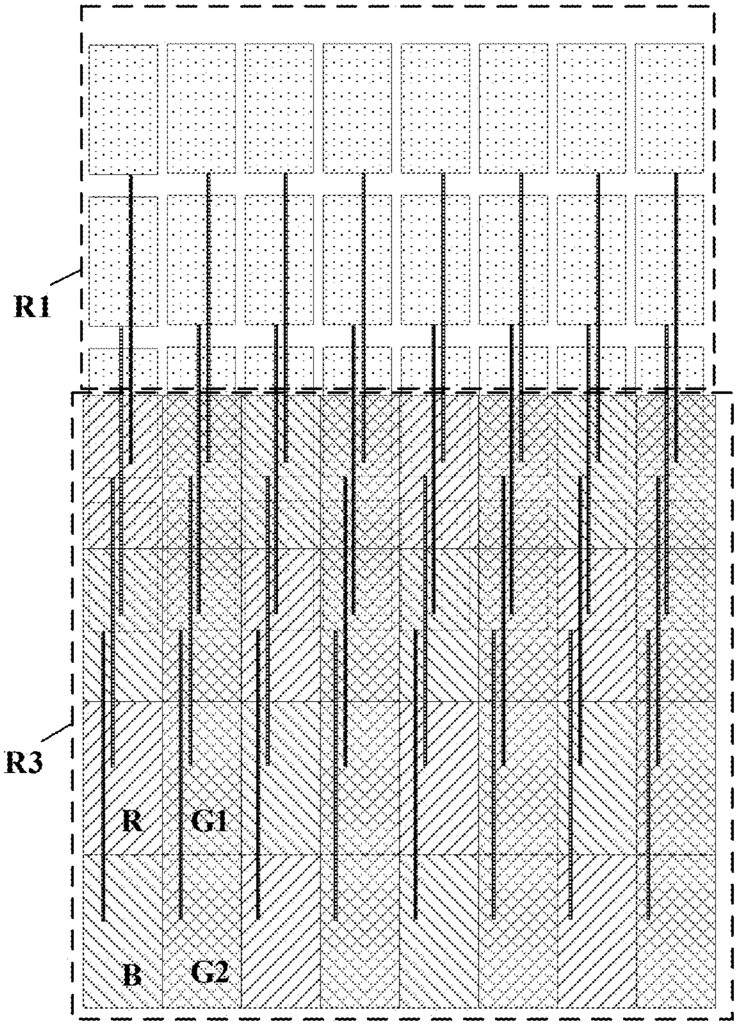
FIG. 8A illustrates an exemplary implementation in an array substrate in some embodiments according to the present disclosure.
Figure 8B:
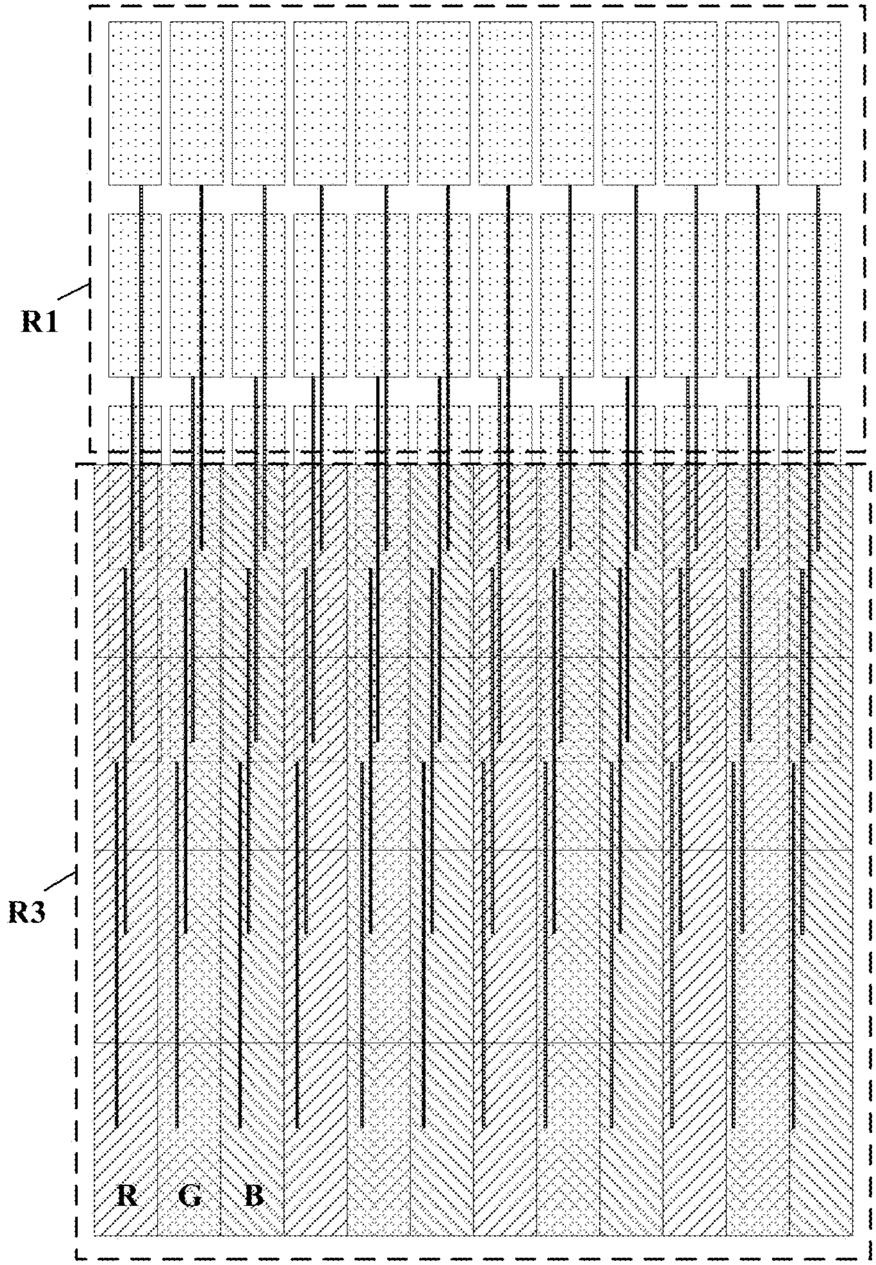
FIG. 8B illustrates an exemplary implementation in an array substrate in some embodiments according to the present disclosure.

The present array substrate layout may be implemented in various appropriate types of array substrates. FIG. 8A illustrates an exemplary implementation in an array substrate in some embodiments according to the present disclosure. A pixel of the array substrate includes a red subpixel R, a blue subpixel B, a first green subpixel G1, and a second green subpixel G2. FIG. 8B illustrates an exemplary implementation in an array substrate in some embodiments according to the present disclosure. A pixel of the array substrate includes a red subpixel R, a blue subpixel B, a green subpixel G.

Figure 9:
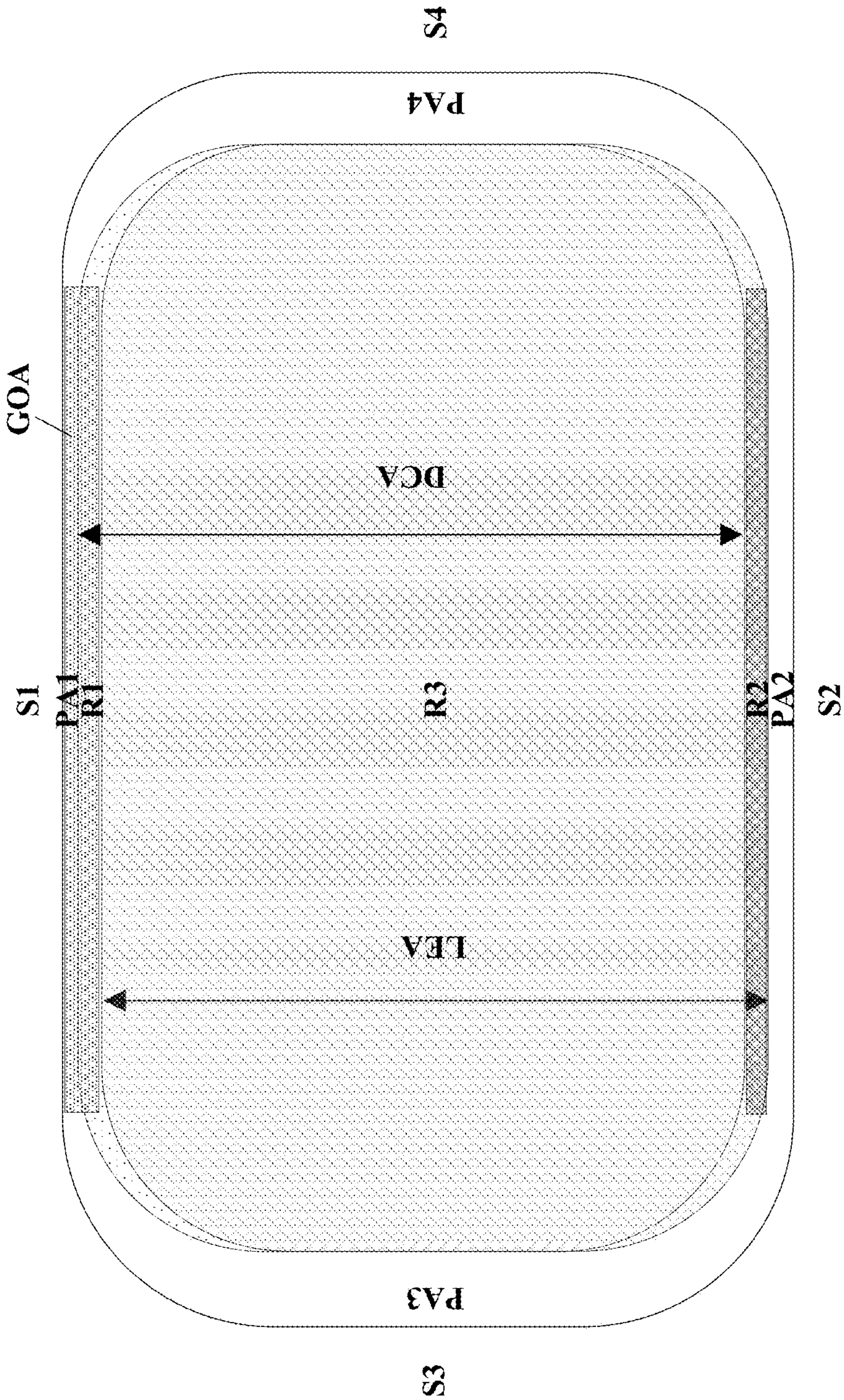
FIG. 9 is a schematic diagram illustrating the structure of an array substrate in some embodiments according to the present disclosure.

FIG. 9 is a schematic diagram illustrating the structure of an array substrate in some embodiments according to the present disclosure. Referring to FIG. 9, in some embodiments, the array substrate includes a first region R1 and a second region R2. In the first region R1, transistors and capacitors of multiple pixel driving circuits of the plurality of pixel driving circuits are present. The plurality of light emitting elements are absent in the first region R1. In the second region R2, multiple light emitting elements of the plurality of light emitting elements are present. Transistors and capacitors of the plurality of pixel driving circuits are absent in the second region R2. The array substrate further includes a peripheral region surrounding a combination of the first region R1, the second region R2, and the third region R3. Optionally, the peripheral region includes a first peripheral sub-region PA1 on a first side S1, a second peripheral sub-region PA2 on a second side S2, a third peripheral sub-region PA3 on a third side S3, and a fourth peripheral sub-region PA4 on a fourth side S4. The peripheral region is absent of any light emitting elements and any pixel driving circuits. Optionally, the array substrate further includes a gate-on-array GOA circuit at least partially in the first peripheral sub-region PA1. In one example, the gate-on-array GOA circuit is partially in the first peripheral sub-region PA1 and partially in the first region R1.

Figure 10:
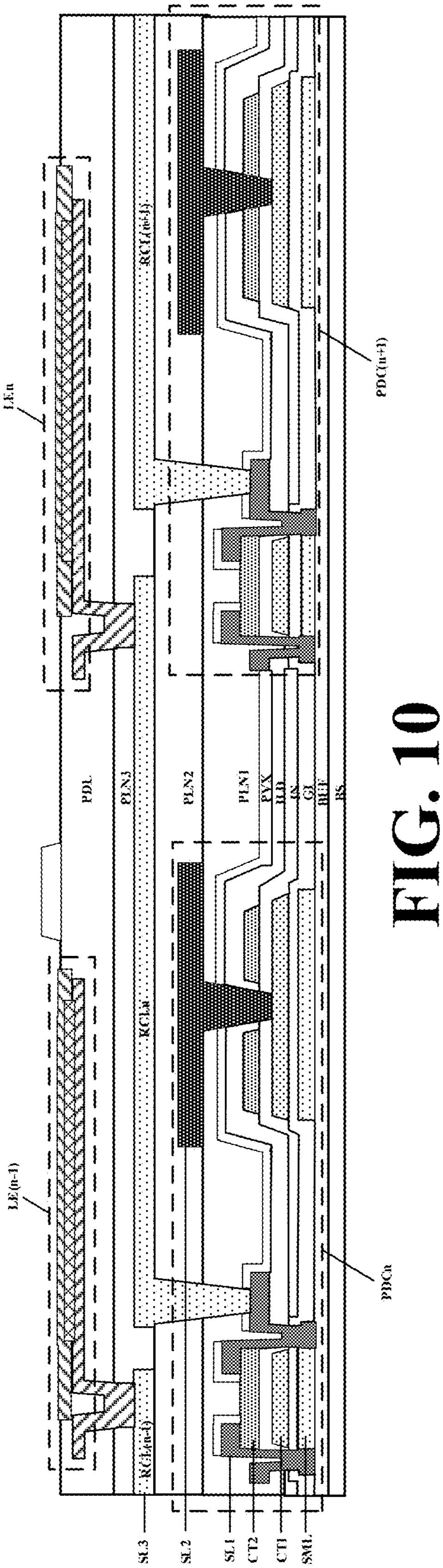
FIG. 10 is a cross-sectional view of an array substrate in some embodiments according to the present disclosure.

FIG. 10 is a cross-sectional view of an array substrate in some embodiments according to the present disclosure. FIG. 10 shows a portion of the array substrate in the third region. Referring to FIG. 10, an n-th respective connecting line RCLn connects an n-th respective pixel driving circuit PDCn to an n-th respective light emitting element LEn; an (n+1)-th respective connecting line RCL(n+1) connects an (n+1)-th respective pixel driving circuit PDC(n+1) to an (n+1)-th respective light emitting element; an (n−1)-th respective connecting line RCL(n−1) connects an (n−1)-th respective pixel driving circuit to an (n−1)-th respective light emitting element LE(n−1). As shown in FIG. 10, an orthographic projection of the (n−1)-th respective light emitting element LE(n−1) on a base substrate BS at least partially overlaps with an orthographic projection of the n-th respective pixel driving circuit PDCn on the base substrate BS. An orthographic projection of the n-th respective light emitting element LEn on the base substrate BS at least partially overlaps with an orthographic projection of the (n+1)-th respective pixel driving circuit PDC(n+1) on the base substrate BS.

Optionally, an orthographic projection of a light emitting layer of the (n−1)-th respective light emitting element LE(n−1) on the base substrate BS at least partially overlaps with an orthographic projection of the n-th respective pixel driving circuit PDCn on the base substrate BS. Optionally, an orthographic projection of a light emitting layer of the n-th respective light emitting element LEn on the base substrate BS at least partially overlaps with an orthographic projection of the (n+1)-th respective pixel driving circuit PDC(n+1) on the base substrate BS.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

In some embodiments, the display apparatus includes a camera in a window region. The display panel of the display apparatus is configured to display image in the window region, for example, the display panel extends at least partially (e.g., completely) through the window region. In some embodiments, the display apparatus includes multiple light emitting elements in the window region, and multiple pixel driving circuits configured to drive light emission in the multiple light emitting elements. In the window region, the multiple light emitting elements are present, and transistors of the multiple pixel driving circuits are absent. Outside the window region (e.g., in the normal display region), the multiple light emitting elements are absent, and transistors of the multiple pixel driving circuits are present.

In another aspect, the present invention provides a method of fabricating an array substrate. In some embodiments, the method includes forming a plurality of light emitting elements and forming a plurality of pixel driving circuits configured to drive light emission in the plurality of light emitting elements. Optionally, in a first region, transistors of multiple pixel driving circuits of the plurality of pixel driving circuits are present, and the plurality of light emitting elements are absent. Optionally, in a second region, multiple light emitting elements of the plurality of light emitting elements are present, and transistors of the plurality of pixel driving circuits are absent.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a plurality of light emitting elements, a plurality of pixel driving circuits configured to drive light emission in the plurality of light emitting elements, a plurality of data lines, and a plurality of data lead lines, the plurality of data lead lines electrically connecting the plurality of data lines to an integrated circuit;

wherein an orthographic projection of at least one light emitting element of the plurality of light emitting elements on a base substrate at least partially overlaps with an orthographic projection of the plurality of data lead lines on the base substrate;

wherein the array substrate further comprises a plurality of connecting lines connecting the plurality of pixel driving circuits with the plurality of light emitting elements, respectively;

wherein an orthographic projection of at least one connecting line of the plurality of connecting lines on the base substrate at least partially overlaps with an orthographic projection of the plurality of data lead lines on the base substrate.

2. The array substrate of claim 1, wherein an orthographic projection of at least one data lead line of the plurality of data lead lines on the base substrate partially overlaps with an orthographic projection of the plurality of light emitting elements on the base substrate; and an extension direction of at least a portion of the at least one data lead line is different from an extension direction of a data line connected to the at least one data lead line.

3. The array substrate of claim 1, wherein a data lead line of the plurality of data lead lines comprises a first part and a second part;

an extension direction of the first part is the same as an extension direction of a data line connected to the data lead line; and an extension direction of the second part is different from the extension direction of the data line connected to the data lead line.

4. The array substrate of claim 1, wherein a data lead line of the plurality of data lead lines connects to a data line of the plurality of data lines at a connection point; and an extension direction of the data line changes to an extension direction of the data lead line at the connection point.

5. The array substrate of claim 1, wherein at least a portion of a data lead line of the plurality of data lead lines is in a layer different from a data line of the plurality of data lines; and the at least the portion of the data lead line connects to the data line through a via extending through at least one insulating layer.

6. The array substrate of claim 5, wherein the via is at least partially in a light emitting area having one or more light emitting elements.

7. The array substrate of claim 1, further comprising:

an anode connecting line;

a planarization layer on the anode connecting line; and an anode layer on a side of the planarization layer away from the anode connecting line;

wherein an anode in the anode layer connects to the anode connecting line through a via extending through the planarization layer.

8. The array substrate of claim 1, wherein at least a portion of at least one data lead line of the plurality of data lead lines are in a same layer as a data line connected to the at least one data lead line.

9. The array substrate of claim 8, wherein a shortest distance between the light emitting area and an integrated circuit is in a range of 1000 μm to 10000 μm.

10. The array substrate of claim 1, wherein at least a portion of at least one data lead line of the plurality of data lead lines are in a layer different from a data line connected to the at least one data lead line.

11. The array substrate of claim 1, wherein at least two data lead lines of the plurality of data lead lines have different lengths.

12. The array substrate of claim 1, further comprising a peripheral region;

wherein the peripheral region comprises a first peripheral sub-region on a first side, a second peripheral sub-region on a second side, a third peripheral sub-region on a third side, and a fourth peripheral sub-region on a fourth side; and the array substrate further comprises a gate-on-array circuit on at least one of the third peripheral sub-region or the fourth peripheral sub-region.

13. The array substrate of claim 1, further comprising a plurality of connecting lines connecting the plurality of pixel driving circuits with the plurality of light emitting elements, respectively;

wherein two terminals of a respective connecting line of the plurality of connecting lines intersects with a column direction.

14. The array substrate of claim 13, wherein an extension direction of at least a portion of at least one connecting line of the plurality of connecting lines is parallel to the column direction.

15. The array substrate of claim 1, wherein the plurality of data lead lines are in a region absent of transistors and capacitors of the plurality of pixel driving circuits; and multiple light emitting elements of the plurality of light emitting elements are present in the region having the plurality of data lead lines.

16. The array substrate of claim 1, wherein extension directions of at least portions of the plurality of data lead lines are different from an extension direction of the plurality of data lines.

17. The array substrate of claim 1, wherein a respective data lead line of the plurality of data lead lines extends from a connection point with a respective data line of the plurality of data lines to the integrated circuit.

18. A display apparatus, comprising the array substrate of claim 1, and one or more integrated circuit connected to the array substrate.

19. An array substrate, comprising a plurality of light emitting elements, a plurality of pixel driving circuits configured to drive light emission in the plurality of light emitting elements, a plurality of data lines at least partially, and a plurality of data lead lines, the plurality of data lead lines electrically connecting the plurality of data lines to an integrated circuit;

wherein an orthographic projection of at least one light emitting element of the plurality of light emitting elements on a base substrate at least partially overlaps with an orthographic projection of the plurality of data lead lines on the base substrate; and at least two data lead lines of the plurality of data lead lines have different lengths;

wherein the array substrate further comprises a plurality of connecting lines connecting the plurality of pixel driving circuits with the plurality of light emitting elements, respectively; and the plurality of connecting lines extend on the array substrate without intersecting each other.

* * * * *